US012777927B2

(12) United States Patent
Ahn et al.

(10) Patent No.: US 12,777,927 B2
(45) Date of Patent: Oct. 27, 2026

(54) SEMICONDUCTOR PACKAGES HAVING HEAT DISSIPATION PILLARS

(71) Applicant: Samsung Electronics Co., Ltd., Suwon-si (KR)

(72) Inventors: Seokgeun Ahn, Suwon-si (KR); Cheol Kim, Suwon-si (KR); Hwanyoung Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 326 days.

(21) Appl. No.: 18/378,603

(22) Filed: Oct. 10, 2023

(65) Prior Publication Data

US 2024/0170358 A1 May 23, 2024

(30) Foreign Application Priority Data

Nov. 18, 2022 (KR) ........................ 10-2022-0155072

(51) Int. Cl.
*H10W 40/22* (2026.01)
*H10P 72/10* (2026.01)
(Continued)

(52) U.S. Cl.
CPC ........... *H10W 40/22* (2026.01); *H10W 72/30* (2026.01); *H10W 72/851* (2026.01);
(Continued)

(58) Field of Classification Search
CPC ... H01L 23/367; H01L 23/3128; H01L 24/16; H01L 24/32; H01L 24/48; H01L 24/73; H01L 25/105; H01L 2224/16145; H01L 2224/16225; H01L 2224/48227; H01L 2225/1058; H01L 2924/3511; H01L 2221/68359; H01L 23/36; H01L 2225/06589; H01L 21/6835; H01L 23/3677; H01L 2221/68345; H01L 23/3185; H01L 24/04; H01L 25/0657; H01L 25/18; H01L 2225/1094; H10W 72/30; H10W 72/851; H10W 74/117;
(Continued)

(56) References Cited

U.S. PATENT DOCUMENTS

| | | | |
|---|---|---|---|
| 7,964,951 | B2 | 6/2011 | Refai-Ahmed |
| 8,877,563 | B2 | 11/2014 | Chandrasekaran |

(Continued)

FOREIGN PATENT DOCUMENTS

| | | | |
|---|---|---|---|
| KR | 10-1111423 | B1 | 2/2012 |
| KR | 1020210096497 | A | 8/2021 |
| KR | 1020210104364 | A | 8/2021 |

*Primary Examiner* — Herve-Louis Y Assouman
(74) *Attorney, Agent, or Firm* — Muir Patent Law, PLLC

(57) ABSTRACT

A semiconductor package includes a lower redistribution structure, a first semiconductor chip and a second semiconductor chip that stacked on the lower redistribution structure, the second semiconductor chip including a heat dissipation pad disposed at an upper surface of the second semiconductor chip, a lower conductive pillar disposed on the lower redistribution structure, an upper conductive pillar disposed on the lower conductive pillar, a heat dissipation pillar disposed on the heat dissipation pad, an upper redistribution structure disposed on the upper conductive pillar; and a heat dissipation structure disposed on the heat dissipation pillar.

19 Claims, 21 Drawing Sheets

(51) Int. Cl.

| | |
|---|---|
| ***H10W 40/10*** | (2026.01) |
| ***H10W 72/00*** | (2026.01) |
| ***H10W 72/30*** | (2026.01) |
| ***H10W 72/50*** | (2026.01) |
| ***H10W 72/90*** | (2026.01) |
| ***H10W 74/10*** | (2026.01) |
| ***H10W 90/00*** | (2026.01) |
| ***H10W 90/20*** | (2026.01) |

(52) U.S. Cl.
CPC .......... *H10W 74/117* (2026.01); *H10W 90/00* (2026.01); *H10W 90/722* (2026.01); *H10W 90/724* (2026.01); *H10W 90/754* (2026.01)

(58) Field of Classification Search
CPC . H10W 74/141; H10W 90/00; H10W 90/288; H10W 90/722; H10W 90/724; H10W 40/10; H10W 40/22; H10W 40/228; H10W 72/20; H10W 72/50; H10W 72/90; H10W 90/754; H10P 72/74; H10P 72/7424; H10P 72/743
See application file for complete search history.

(56) References Cited

U.S. PATENT DOCUMENTS

| | | | |
|---|---|---|---|
| 9,589,878 B2 | 3/2017 | Ryu et al. | |
| 11,088,058 B2 | 8/2021 | Tseng et al. | |
| 2019/0096791 A1* | 3/2019 | Jeng | H01L 23/3114 |
| 2019/0139852 A1 | 5/2019 | Yu et al. | |
| 2020/0006191 A1 | 1/2020 | Pei et al. | |
| 2021/0193620 A1 | 6/2021 | Refai-Ahmed et al. | |
| 2021/0305112 A1* | 9/2021 | Tseng | H01L 24/32 |

* cited by examiner

SEMICONDUCTOR PACKAGES HAVING HEAT DISSIPATION PILLARS

CROSS-REFERENCE TO RELATED APPLICATION

This application claims the priority and benefit of Korean Patent Application No. 10-2022-0155072, filed on Nov. 18, 2022, with the Korean Intellectual Property Office, the inventive concept of which is herein incorporated by reference.

BACKGROUND

1. Field

The present inventive concept is to provide a semiconductor package having a heat dissipation pillar.

2. Description of Related Art

As demands for high performance, high speed, and/or multifunctionality of semiconductor devices increase, a degree of integration of semiconductor devices is increasing. As a result, an amount of heat generated from a semiconductor package is increasing, and a technology for efficiently dissipating the heat generated from the semiconductor package is desirable.

SUMMARY

An aspect of the present inventive concept is to provide a semiconductor package having a heat dissipation pillar connected to a semiconductor chip.

According to example embodiments, a semiconductor package includes a lower redistribution structure, a first semiconductor chip disposed on a first region of the lower redistribution structure, a second semiconductor chip stacked on the first semiconductor chip, and wherein the second semiconductor chip includes a heat dissipation pad that is disposed at an upper surface of the second semiconductor chip, a lower conductive pillar disposed on a second region of the lower redistribution structure, wherein, when viewed in a plan view, the second region is disposed outside an outer boundary of the first region, an upper conductive pillar disposed on the lower conductive pillar, a heat dissipation pillar disposed on the heat dissipation pad, an upper redistribution structure disposed on the upper conductive pillar, and a heat dissipation structure disposed on the heat dissipation pillar.

According to example embodiments, a semiconductor package includes a lower redistribution structure, a first connection layer disposed on the lower redistribution structure and including a first semiconductor chip disposed on the lower redistribution structure and a second semiconductor chip disposed on the first semiconductor chip, a second connection layer disposed on the first connection layer and including a heat dissipation pillar disposed on the second semiconductor chip, and an upper redistribution structure disposed on the second connection layer, wherein the upper redistribution structure has an opening exposing a portion of the second connection layer, and a heat dissipation structure disposed in the opening and connected to the heat dissipation pillar.

According to example embodiments, a semiconductor package includes a lower redistribution structure, a first semiconductor chip and a second semiconductor chip stacked on the lower redistribution structure, wherein the second semiconductor chip is disposed between the first semiconductor chip and the lower redistribution structure, and wherein the second semiconductor chip includes a heat dissipation pad that is disposed at an upper surface of the second semiconductor chip and a heat dissipation via disposed under the heat dissipation pad, a lower conductive pillar disposed on the lower redistribution structure, a lower encapsulant covering an upper surface of the lower redistribution structure, and a sidewall of each of the lower conductive pillar, the first semiconductor chip, and the second semiconductor chip, an upper conductive pillar disposed on the lower conductive pillar, a heat dissipation pillar disposed on the heat dissipation pad, a first bonding member covering a side surface of the upper conductive pillar, a second bonding member covering a side surface of the heat dissipation pillar, an upper encapsulant covering a side surface of each of the first bonding member and the second bonding member, an upper redistribution structure disposed on the upper conductive pillar, and a heat dissipation structure disposed on the heat dissipation pillar, wherein the upper redistribution structure includes an opening in which the heat dissipation structure is disposed, and wherein the upper redistribution structure surrounds the heat dissipation structure.

BRIEF DESCRIPTION OF DRAWINGS

The above and other aspects, features, and advantages of the present inventive concept will be more clearly understood from the following detailed description taken in conjunction with the accompanying drawings, in which.

DETAILED DESCRIPTION

Hereinafter, preferred example embodiments of the present inventive concept will be described with reference to the accompanying drawings as follows.

Figure 1:
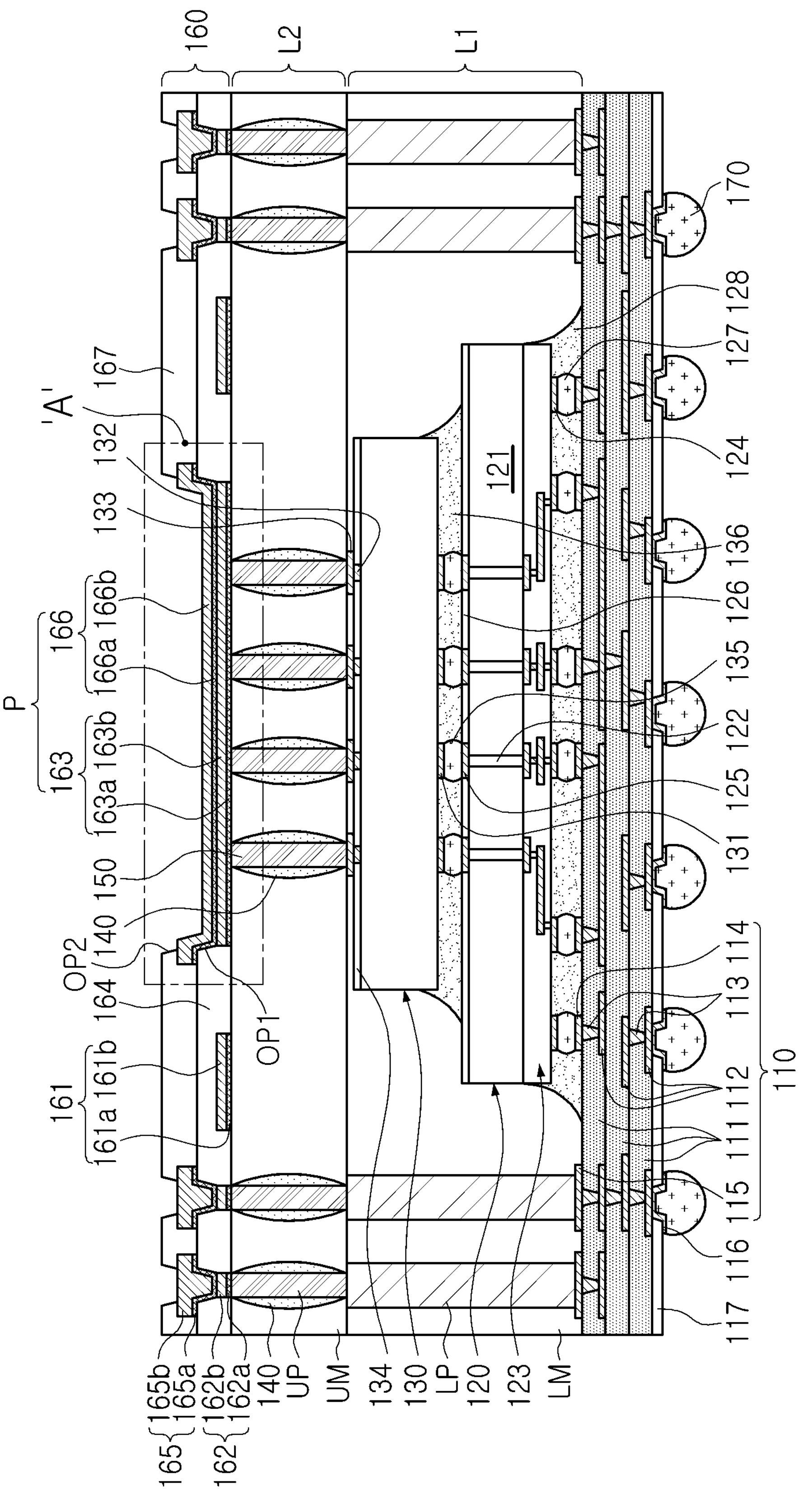
FIG. 1 is a cross-sectional view of a semiconductor package according to example embodiments.
Figure 2:
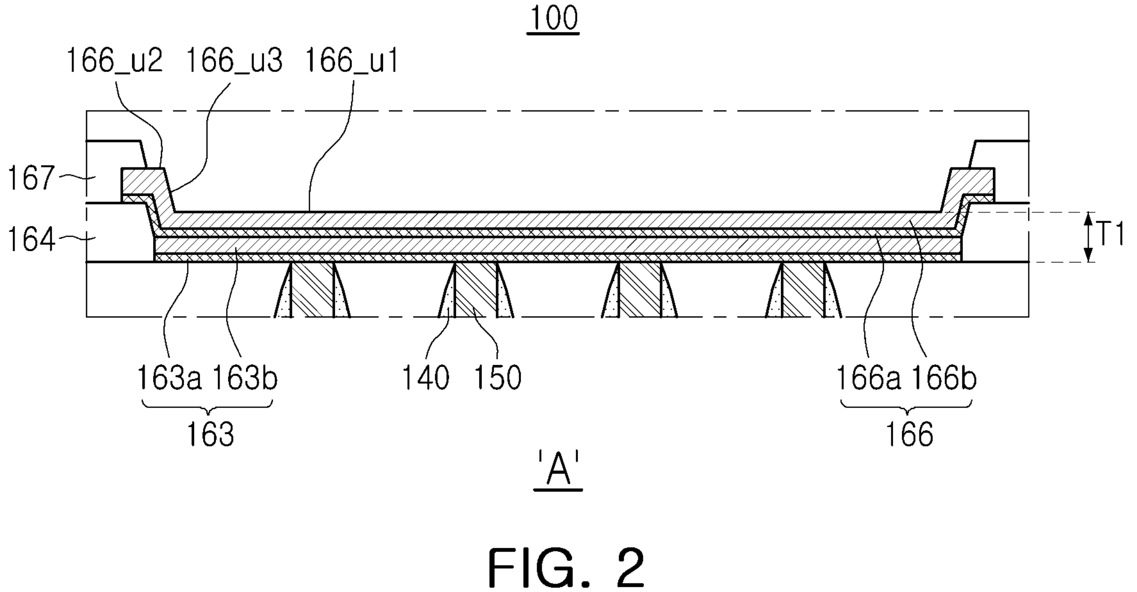
FIG. 2 is a partially enlarged vie of the semiconductor package illustrated in FIG. 1.

FIG. 1 is a cross-sectional view of a semiconductor package according to example embodiments. FIG. 2 is a partially enlarged view of the semiconductor package illustrated in FIG. 1. FIG. 2 may correspond to region A illustrated in FIG. 1.

Referring to FIGS. 1 and 2, a semiconductor package 100 according to an example embodiment of the present disclosure may include a lower redistribution structure 110, a first connection layer L1, a second connection layer L2, and an upper redistribution structure 160, a heat dissipation structure P, and an external connection terminal 170.

The lower redistribution structure 110 may include an insulating layer 111, an internal wiring 112, a via 113, a first connection pad 114, and a second connection pad 115. The insulating layers 111 may form a plurality of layers, and the internal wirings 112 may be formed between the insulating layers 111 and extend in a horizontal direction. The vias 113 may connect internal wirings 112 of different layers with each other. The internal wirings 112 and vias 113 may be buried in insulating layers 111. The first connection pad 114 and the second connection pad 115 may be disposed on the uppermost insulation layer 111 among the insulation layers 111. The first connection pad 114 may be disposed on a central portion of an upper surface of the lower redistribution structure 110, and the second connection pad 115 may be disposed at an edge region of the upper surface of the lower redistribution structure 110. In some example embodiments, a horizontal width of the second connection pad 115 may be greater than a horizontal width of the first connection pad 114. The first connection pad 114 and the second connection pad 115 may be electrically connected to the internal wiring 112 through the via 113. The horizontal width may be measured in a direction parallel to an upper surface of the lower redistribution structure 110.

The semiconductor package 100 may further include a bump pad 116 and an insulating layer 117 disposed below the lower redistribution structure 110. The bump pad 116 may be connected to at least one of the internal wirings 112, and the insulating layer 117 may cover a lower surface of the lowermost insulating layer among the insulating layers 111. The bump pad 116 may not be covered by the insulating layer 117, and may be connected to the external connection terminal 170. The insulating layer 117 may have an opening in which the bump pad 116 may be disposed.

The first connection layer L1 may be disposed on the lower redistribution structure 110. The first connection layer L1 may include a lower conductive pillar LP, a first semiconductor chip 120, a second semiconductor chip 130, and a lower encapsulant LM. The lower conductive pillar LP may be connected to the lower redistribution structure 110. For example, the lower conductive pillar LP may be disposed on the second connection pad 115 of the lower redistribution structure 110, and may be disposed at an edge region of an upper surface of the lower redistribution structure 110.

The first semiconductor chip 120 may be mounted on the lower redistribution structure 110, and the second semiconductor chip 130 may be mounted on the first semiconductor chip 120. The first semiconductor chip 120 and the second semiconductor chip 130 may be logic chips or memory chips. The logic chip may include a microprocessor, an analog device, or a digital signal processor. The memory chip may include a volatile memory chip such as dynamic random access memory (DRAM) and static random access memory (SRAM), or a non-volatile memory chip such as phase-change random access memory (PRAM), magnetoresistive random access memory (MRAM), ferroelectiic random access memory FeRAM) and resistive random access memory (RRAM). In an example embodiment, both the first semiconductor chip 120 and the second semiconductor chip 130 may be logic chips. In an example embodiment, the first semiconductor chip 120 may be a logic chip, and the second semiconductor chip 130 may be an SRAM chip or a DRAM chip. In an example embodiment, the first semiconductor chip 120 may be a memory chip, and the second semiconductor chip 130 may be a logic chip.

The first semiconductor chip 120 may include a semiconductor body 121, a through-electrode 122 vertically penetrating through the semiconductor body 121, a circuit layer 123 below the semiconductor body 121, a chip pad 124 below the circuit layer, and a chip connection pad 125 and a passivation layer 126 above the semiconductor body 121. The chip pad 124 may be electrically connected to the chip connection pad 125 through the circuit layer 123 and the through-electrode 122. The passivation layer 126 may cover an upper portion of the semiconductor body 121 and a side surface of the chip connection pads 125, but an upper surface of the chip connection pad 125 may not be covered by the passivation layer 126. The first semiconductor chip 120 may be mounted on a central portion of an upper surface of the lower redistribution structure 110, and the chip pad 124 may be connected to the first connection pad 114 through a connection bump 127. The underfill 128 may cover a portion of the upper surface of the lower redistribution structure 110 and the connection bump 127.

The second semiconductor chip 130 may include a chip pad 131 disposed therebelow, a heat dissipation via 132, a heat dissipation pad 133. and a passivation layer 134 disposed thereabove. The chip pad 131 may be connected to the chip connection pad 125 through the connection bump 135. The underfill 136 may cover a portion of the upper surface of the first semiconductor chip 120 and the connection bump 135. The second semiconductor chip 130 may be electrically connected to the lower redistribution structure 110 through the first semiconductor chip 120. The heat dissipation via 132 and the heat dissipation pad 133 may be disposed above the second semiconductor chip 130, and the passivation layer 134 may cover an upper surface of the second semiconductor chip 130. A side surface of the heat dissipation vias 132 may be covered by the passivation layer 134. The heat dissipation pad 133 may be disposed on the heat dissipation via 132 and the passivation layer 134. The heat dissipation pad 133 and the heat dissipation via 132 are for dissipating heat from the second semiconductor chip 130, and may not be electrically connected to the chip pad 131. The heat dissipation via 132 may contact the heat dissipation pad 133 to form a heat dissipation path between the second semiconductor chip 130 and the outside of the semiconductor package 100. The heat dissipation via 132 may be electrically floating.

The lower encapsulant LM may cover the lower redistribution structure 110, the lower conductive pillar LP, the first semiconductor chip 120, and the second semiconductor chip 130. Upper surfaces of the lower conductive pillar LP and the heat dissipation pad 133 may be coplanar with the lower encapsulant LM. A portion of the lower encapsulant LM may cover an upper surface of the second semiconductor chip 130. Since a portion of the lower encapsulant LM is disposed above the second semiconductor chip 130, warpage of the semiconductor package 100 may be reduced or prevented during a manufacturing process thereof.

A second connection layer L2 may be disposed on the first connection layer L1. The second connection layer L2 may include an upper conductive pillar UP, a bonding member HO, a heat dissipation pillar 150, and an upper encapsulant UM. The upper conductive pillar UP may be disposed at an edge region of the semiconductor package 100 in a plan view, and may be disposed on the lower conductive pillar LP. A side surface of the upper conductive pillar UP may be covered by the bonding member 140, and may not contact the upper encapsulant UM. In an embodiment, the side surface of the upper conductive pillar UP may be spaced apart from the upper encapsulant UM with the bonding member 140 disposed therebetween. The upper conductive pillar UP may be electrically connected to the lower redistribution structure 110 through the lower conductive pillar LP. FIG. 1 illustrates that a diameter of the upper conductive pillar UP is smaller than a diameter of the lower conductive pillar LP, but an example embodiment thereof is not limited thereto. The diameters may be measured in a horizontal direction that is parallel to an upper surface of the lower redistribution stricture 110. The term "contact," as used herein, refers to a direct connection (i.e., physical touching) unless the context indicates otherwise.

The heat dissipation pillar 150 may be disposed on a central portion of the semiconductor package 100 in a plan view, and may be disposed on the heat dissipation pad 133, In an embodiment, the heat dissipation pillar 150 (e.g., a lower end of the heat dissipation pillar) may contact the heat dissipation pad 133. A side surface of the heat dissipation pillar 150 may be covered by the bonding member 140, and may not contact the upper encapsulant UM. In an embodiment, the bonding member 140 may be interposed between the side surface of the heat dissipation pillar 150 and the upper encapsulant UM. The heat dissipation pillar 150 may be used to externally dissipate heat that is generated from the second semiconductor chip 130. The heat may be transferred via the heat dissipation pad 133 from the second semiconductor chip 130. In an embodiment, the heat dissipation pad 133 and the heat dissipation pillar 150 may form a heat dissipation path between the second semiconductor chip 130 and the outside of the semiconductor package 100. A diameter of the heat dissipation pillar 150 may be the same as a diameter of the upper conductive pillar UP, but an example embodiment thereof is not limited thereto. A lower surface of the heat dissipation pillar 150 may be coplanar with a lower surface of the upper conductive pillar UP, and a height of the heat dissipation pillar 150 may be the same as that of the upper conductive pillar UP.

The upper encapsulant UM may cover the lower encapsulant LM, the upper conductive pillar UP, and the heat dissipation pillar 150. A lower surface of the upper encapsulant UM may be coplanar with upper surfaces of the lower conductive pillar LP and the heat dissipation pad 133, and an upper surface of the upper encapsulant UM may be coplanar with upper surfaces of the upper conductive pillar UP and the heat dissipation pillar 150. The upper encapsulant UM may include or may be formed of the same material as the lower encapsulant LM, and a boundary between the upper encapsulant UM and the lower encapsulant LM may be ambiguous.

An upper redistribution structure 160 may be disposed on the second connection layer L2, and may be electrically connected to the lower redistribution structure 110 through the upper conductive pillar UP and the lower conductive pillar LP. The upper redistribution structure 160 may include an internal wiring 161, a lower connection pad 162, a lower insulating layer 164, an upper connection pad 165, and an upper insulating layer 167. The internal wiring 161, the lower connection pad 162, the upper connection pad 165 may include seed layers 161*a*, 162*a*, and 165*a* and metal layers 161*b*, 162*b*, and 165*b*, respectively. The internal wiring 161 and the lower connection pad 162 may contact an upper surface of the upper encapsulant UM. The lower connection pad 162 may be connected to the upper conductive pillar UP, The lower insulating layer 164 may cover the internal g 161 and the lower connection pad 162. The upper connection pad 165 may be disposed on the lower connection pad 162 and the lower insulating layer 164, The upper insulating layer 167 may cover the lower insulating layer 164, and may expose an upper surface of the upper connection pad 165.

A heat dissipation structure P may be disposed on the second connection layer L2, and may be disposed at the same level as the upper redistribution structure 160. For example, a lower surface of the heat dissipation structure P may be coplanar with a lower surface of the upper redistribution structure 160. The upper redistribution structure 160 may extend in a horizontal direction to surround the heat dissipation structure P. In an embodiment, a first opening OP1 may penetrate the lower insulating layer 164 to expose a portion of the upper surface of the upper encapsulant UM. At the exposed portion of the upper surface of the upper encapsulant UM, the heat dissipation pillar 150 (e.g., an upper end thereof) is exposed. The heat dissipation structure P may be disposed in the first opening OP1 to be connected to the heat dissipation pillar 150 (e.g., an upper end of the heat dissipation pillar). In an embodiment, the heat dissipation structure P may contact the upper end of the heat dissipation pillar 150. The heat dissipation structure P may be connected to the heat dissipation pillar 150, and the heat dissipation pillar 150 and the heat dissipation structure P may dissipate heat generated from the second semiconductor chip 130 externally. In an embodiment, the heat dissipation structure P may contact the heat dissipation pillar 150. The heat dissipation structure P, the heat dissipation pillar 150, the heat dissipation pad 133 and the heat dissipation via 132 may form an heat dissipation path between the second semiconductor chip 130 and the outside of the semiconductor package 100. For example, heat generated from the second semiconductor chip 130 may be released to the outside of the semiconductor package 100 via the heat dissipation via 132, the heat dissipation pad 133, and the heat dissipation pillar 150, and the heat dissipation structure P.

Further referring to FIG. 2, in an example embodiment, a heat dissipation structure P may be formed of a plurality of layers. For example, the heat dissipation structure P may include a lower heat dissipation plate 163 and an upper heat dissipation plate 166. A lower surface of the lower heat dissipation plate 163 may contact the upper surface of the heat dissipation pillar 150, and a lower surface of the upper heat dissipation plate 166 may contact the upper surface of the lower heat dissipation plate 163. Other materials such as an adhesive material may not be interposed between the heat dissipation pillar 150 and the lower heat dissipation plate 163, and between the lower heat dissipation plate 163 and the upper heat dissipation plate 166. Accordingly, heat transfer efficiency from the heat dissipation pillar 150 to the heat dissipation structure P may be increased. The upper heat dissipation plate 166 may be formed to be wider in area than the lower heat dissipation plate 163 to increase heat dissipation efficiency. In this specification, that the upper heat dissipation plate 166 is wider than the lower heat dissipation plate 163 may mean that an area of the upper heat dissipation plate 166 viewed from above is greater than an area of the lower heat dissipation plate 163.

In an example embodiment, a process of forming; the heat dissipation structure P may be performed together with a process of forming the upper redistribution structure 160. Accordingly, the lower surface of the lower heat dissipation plate 163 may be positioned at the same level as the lower surfaces of the internal wiring 161 and the lower connection pad 162. The lower surface of the upper heat dissipation plate 166 may be positioned at the same level as the lower surface of the upper connection pad 165. The heat dissipation structure P may not be spaced apart from the upper redistribution structure 160, and may contact the upper redistribution structure 160. A lower surface of the lower heat dissipation plate 163 may contact the upper encapsulant UM, and a side surface of the lower heat dissipation plate 163 may contact the lower insulating layer 164. The lower heat dissipation plate 163 may be flat. For example, an upper surface of the lower heat dissipation plate 163 may be parallel to an upper surface of the upper encapsulant UM. The lower heat dissipation plate 163 may include a seed layer 163*a* and a metal layer 163*b* on the seed layer 163*a*.

The upper heat dissipation plate 166 may contact the lower insulating layer 164 and the upper insulating layer 167. The upper heat dissipation plate 166 may not be entirely covered by the upper insulating layer 167. In an embodiment, a second opening OP2 may penetrate the upper insulating layer 167 to partially expose the upper heat dissipation plate 166. For example, the second opening OP2 may expose an upper surface of a central portion of the upper heat dissipation plate 166, and the upper insulating layer 167 may partially cover an end portion of the upper heat dissipation plate 166. The central portion of the upper heat dissipation plate 166 may contact the lower heat dissipation plate 163, and the edge portion of the upper heat dissipation plate 166 may contact the lower insulating layer 164. In an embodiment, the edge portion of the upper heat dissipation plate 166 may be positioned higher than the central portion of the upper heat dissipation plate 166. The upper heat dissipation plate 166 may not be flat with respect to the upper surface of the lower redistribution structure 110 or the upper surface of the upper encapsulant UM. For example, the upper surface of the upper heat dissipation plate 166 may include a first portion 166_*u*1, a second portion 166_*u*2, and a third portion 166_*u*3 connecting the first portion 166_*u*1 and the second portion 166_*u*2. The first portion 166_*u*1 may correspond to the central portion of the upper heat dissipation plate 166, and the second portion 166_*u*2 may correspond to the edge portion of the upper heat dissipation plate 166. The second portion 166_*u*2 may be positioned at a level higher than that of the first portion 166_*u*1, and the third portion 166_*u*3 may be an inclined surface. The first portion 166_*u*1 may be positioned at a level lower than that of an upper surface of the lower insulating layer 164. The second portion 166_*u*2 is positioned at a level higher than the upper surface of the lower insulating layer 164 and may be positioned at a level lower than the upper surface of the upper insulating layer 167. The upper heat dissipation plate 166 may include a seed layer 166*a* and a metal layer 166*b* on the seed layer 166*a*. A thickness T1 of the heat dissipation structure P may be a value selected from a range of about 0.001 mm to about 1 mm. In an example embodiment, the thickness T1 may be a value between about 0.001 mm and about 0.1 mm. Here, the thickness T1 may mean a thickness between the first portion 166_*u*1 of the upper surface of the upper heat dissipation plate 166 and the lower surface of the lower heat dissipation plate 163.

Figure 3:
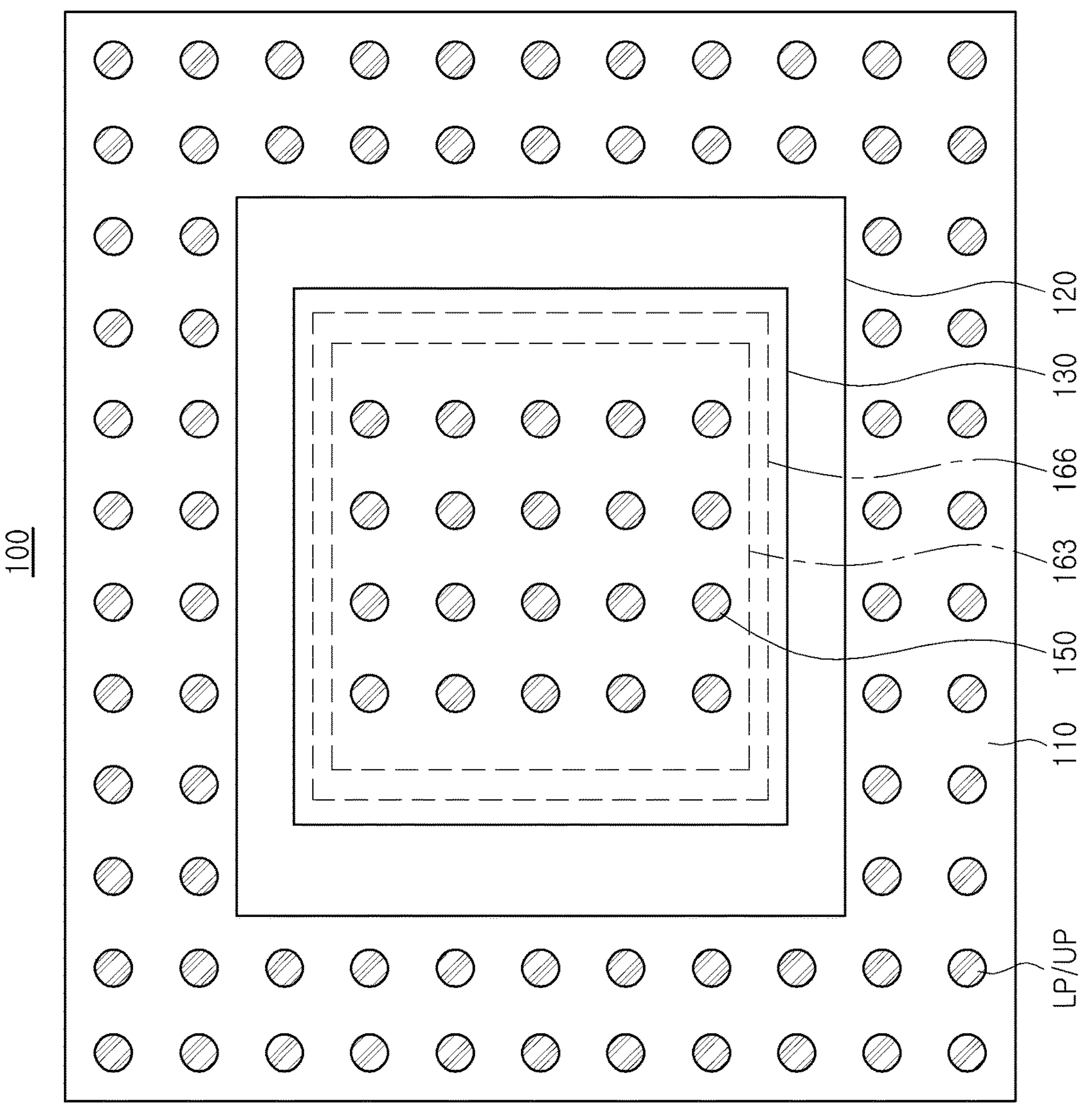
FIG. 3 is a plan view of the semiconductor package illustrated in FIG. 1.

FIG. 3 is a plan view of the semiconductor package illustrated in FIG. 1. FIG. 3 illustrates a first semiconductor chip, a second semiconductor chip, a lower heat dissipation plate and an upper heat dissipation plate viewed from above. Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

Referring to FIG. 3, as described above, in a plan view, the lower conductive pillar LP and the upper conductive pillar UP may be disposed at an edge region of the semiconductor package 100. The heat dissipation pillar 150 may be disposed on a central portion of the semiconductor package 100. The lower heat dissipation plate 163 may overlap the heat dissipation pillars 150 in a vertical direction so as to be connected to all of the heat dissipation pillars 150. The upper heat dissipation plate 166 may vertically overlap the lower heat dissipation plate 163 and may be wider than the lower heat dissipation plate 163. An area of the heat dissipation structure P may be a value selected from a range of about 1 mm×1 mm to about 30 mm×30 mm. In an example embodiment, the area of the heat dissipation structure P may be a value selected from a range of about 5 mm×5 mm to about 30 mm×30 mm. Here, the area of the heat dissipation structure P may mean an area of the upper plate in a plan view.

Figure 4:
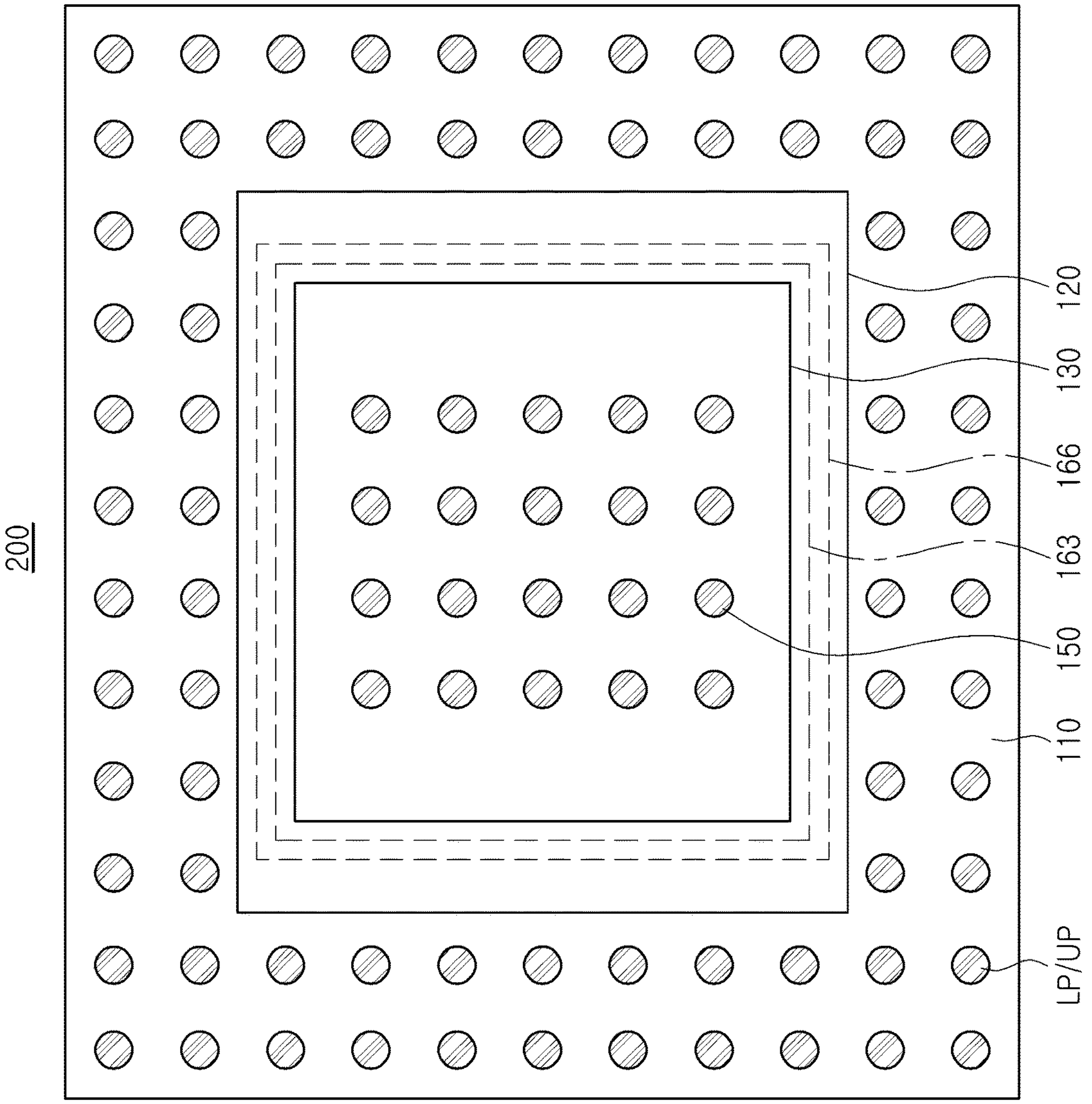
FIGS. 4 and 5 are plan views of semiconductor packages according to example embodiment.
Figure 5:
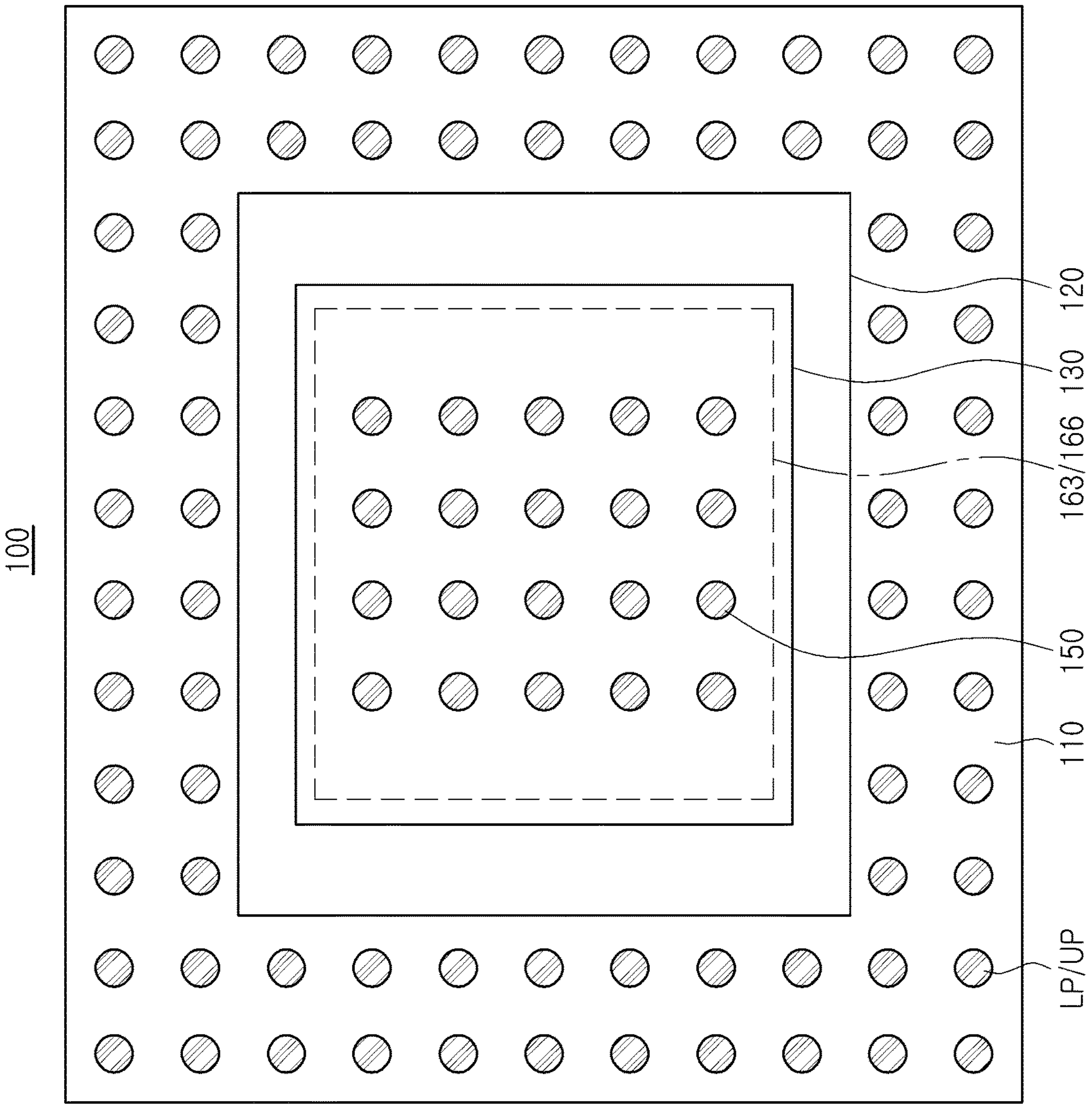

FIGS. 4 and 5 are plan views of semiconductor packages according to example embodiments.

Referring to FIG. 4, a semiconductor package 200 may include a lower heat dissipation plate 163 and an upper heat dissipation plate 166 overlapping the heat dissipation pillar 150. In an example embodiment, the lower heat dissipation plate 163 may be wider than the second semiconductor chip 130, and the upper heat dissipation plate 166 may be wider than the lower heat dissipation plate 163. Although not illustrated, in some example embodiments, the lower heat dissipation plate 163 and the upper heat dissipation plate 166 may be wider than the first semiconductor chip 120.

Referring to FIG. 5, a semiconductor package 300 may include a lower heat dissipation plate 163 and an upper heat dissipation plate 166 overlapping the heat dissipation pillar 150. In an example embodiment, a width of the lower heat dissipation plate 163 may be the same as a width of the upper heat dissipation plate 166. For example, the lower heat dissipation plate 163 may be vertically aligned with the upper heat dissipation plate 166. In an example embodiment, an area of the lower heat dissipation plate 163 may be the same as an area of the upper heat dissipation plate 166. A side surface of the lower heat dissipation plate 163 may be vertically aligned with a side surface of the upper heat dissipation plate 166.

FIGS. 6 to 9 are cross-sectional views of semiconductor packages according to example embodiments. FIGS. 6 to 9 may correspond to region A.

Figure 6:
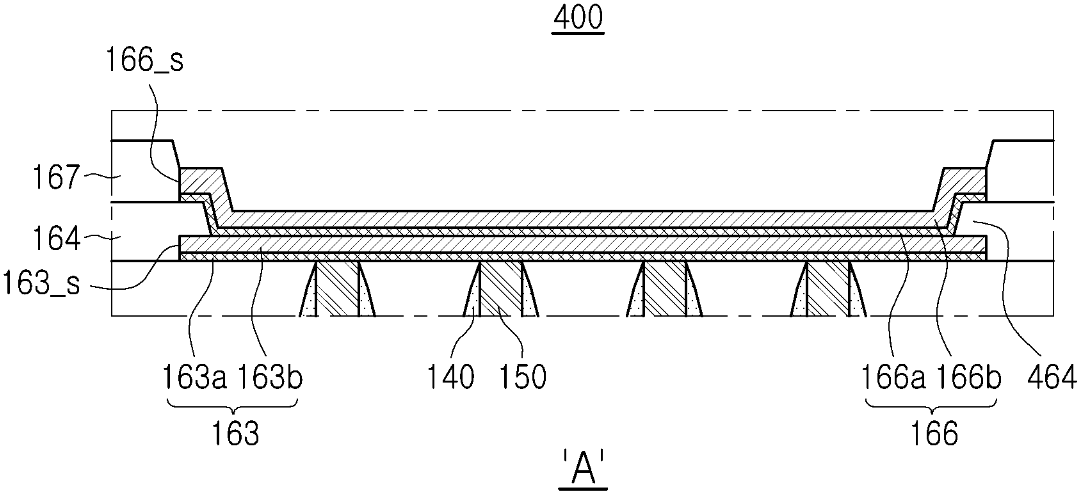
FIGS. 6 to 9 are cross-sectional views of semiconductor packages according to example embodiment.

Referring to FIG. 6, a semiconductor package 400 may include a lower heat dissipation plate 163 and an upper heat dissipation plate 166 on the heat dissipation pillar 150. In an example embodiment, the lower heat dissipation plate 163 and the upper heat dissipation plate 166 may have the same area in a plan view, and may be vertically aligned with each other. For example, a side surface 163_*s* of the lower heat dissipation plate 163 may be vertically aligned with a side surface 166_*s* of the upper heat dissipation plate 166.

In an example embodiment, the lower insulating layer 164 may include a protrusion 464 protruding toward the upper heat dissipation plate 166. The protrusion 464 may contact an upper surface of the lower heat dissipation plate 163 and a lower surface of the upper heat dissipation plate 166.

Figure 7:
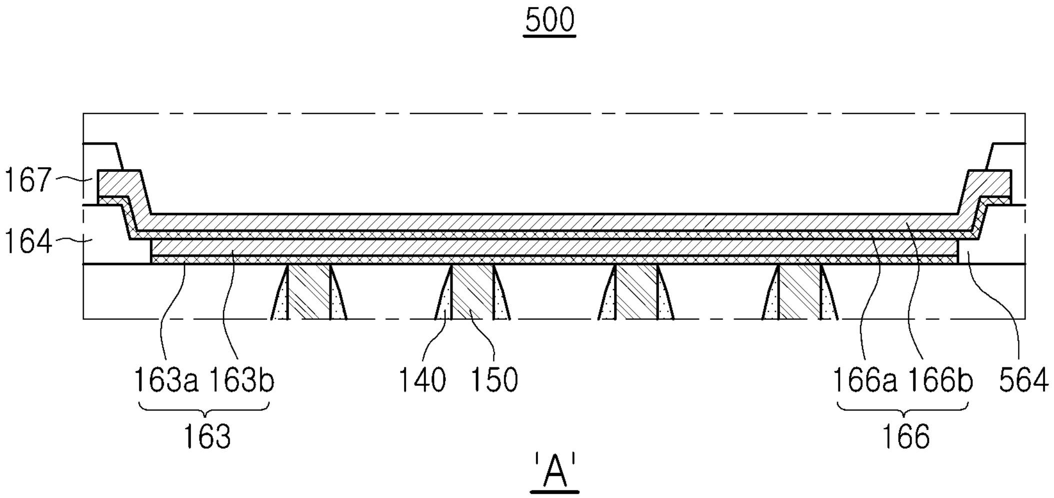

Referring to FIG. 7, a semiconductor package 500 may include a lower heat dissipation plate 163 and an upper heat dissipation plate 166 on the heat dissipation pillar 150. In an example embodiment, the upper heat dissipation plate 166 may be wider than the lower heat dissipation plate 163, and a lower surface of the upper heat dissipation plate 166 may contact the lower insulating layer 164. For example, the lower insulating layer 164 may include a protrusion 564 protruding toward the lower heat dissipation plate 163. The protrusion 564 may contact a side surface of the lower heat dissipation plate 163 and a lower surface of the upper heat dissipation plate 166. A lower surface of the protrusion 564 may be coplanar with a lower surface of the lower heat dissipation plate 163.

Figure 8:
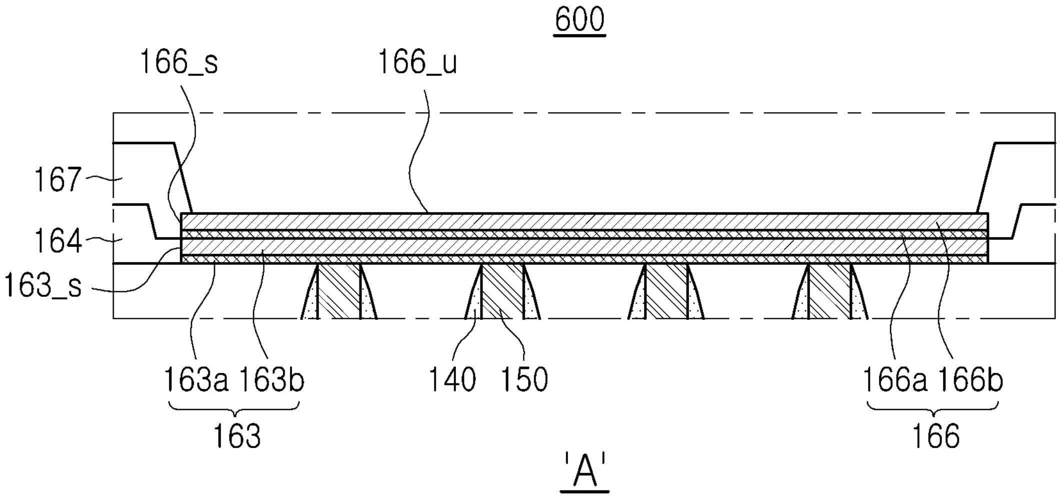

Referring to FIG. 8, a semiconductor package 600 may include a lower heat dissipation plate 163 and an upper heat dissipation plate 166 on the heat dissipation pillar 150. In an example embodiment, an upper surface 166_*u* of the upper heat dissipation plate 166 may be flat. For example, the upper surface 166_*u* of the upper heat dissipation plate 166 may be parallel to an upper surface of the upper encapsulant UM. In an example embodiment, a width of the upper heat dissipation plate 166 may be the same as that of the lower heat dissipation plate 163 and may be vertically aligned. For example, a side surface 163_*s* of the lower heat dissipation plate 163 and a side surface 166_*s* of the upper heat dissipation plate 166 may be vertically aligned with each other.

Figure 9:
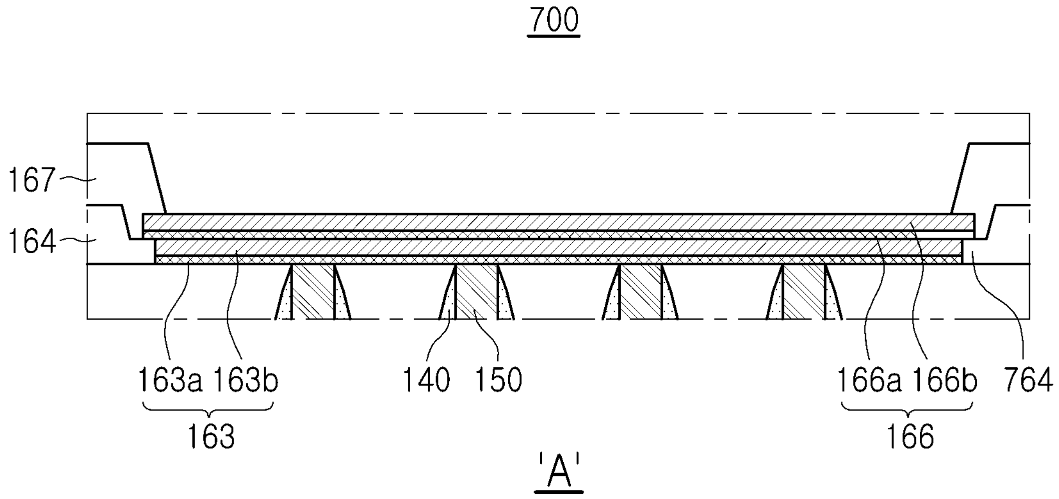

Referring to FIG. 9, a semiconductor package 700 may include a lower heat dissipation plate 163 and an upper heat dissipation plate 166 on the heat dissipation pillar 150. In an example embodiment, an upper surface of the upper heat dissipation plate 166 may be flat, and the upper heat dissipation plate 166 may be wider than the lower heat dissipation plate 163. For example, the lower insulating layer 164 may include a protrusion 764 protruding toward the lower heat dissipation plate 163, and a lower surface of the upper heat dissipation plate 166 may contact the protrusion 764.

Figure 10:
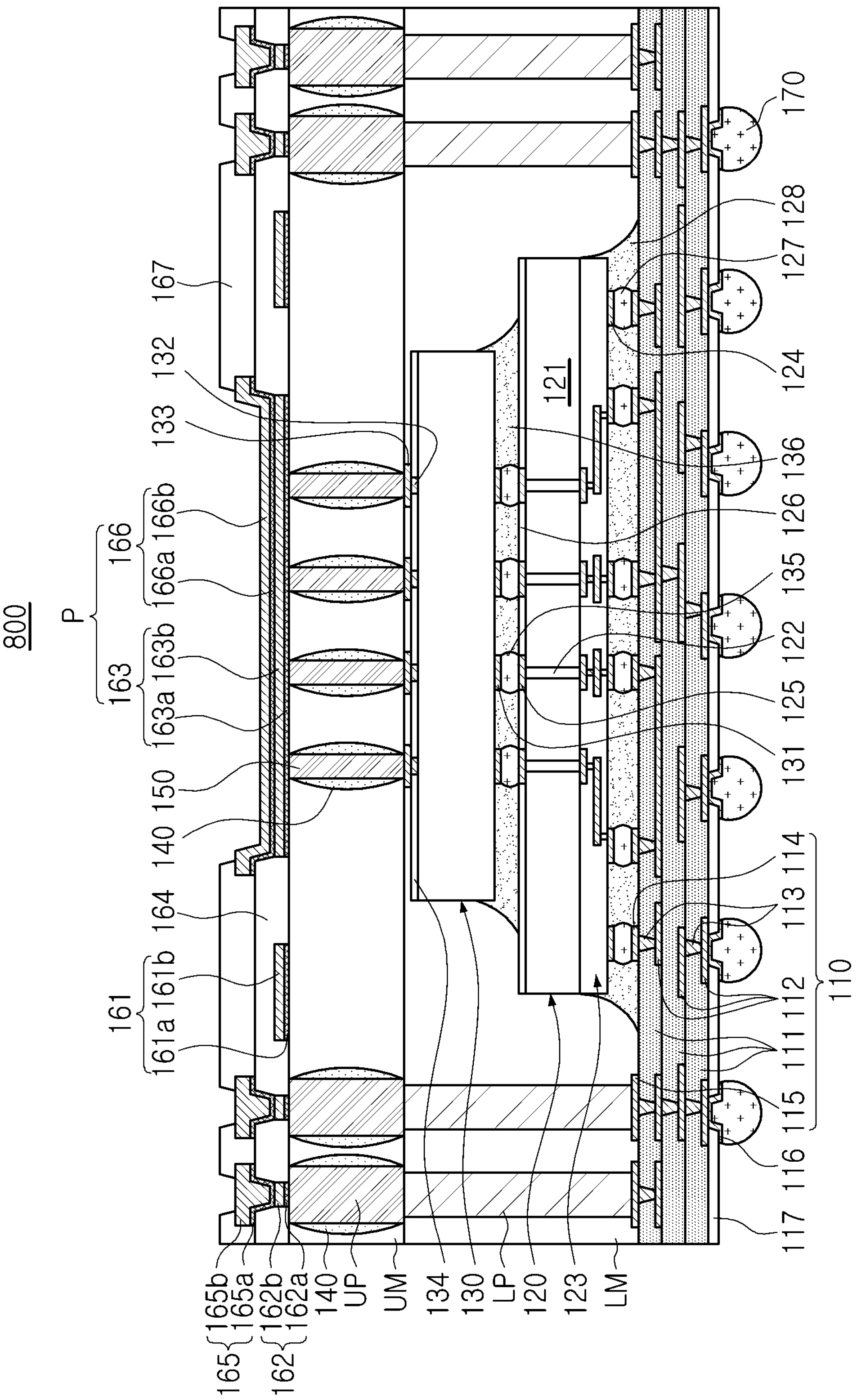
FIGS. 10 and 11 are cross-sectional views of semiconductor packages according to example embodiment.
Figure 11:
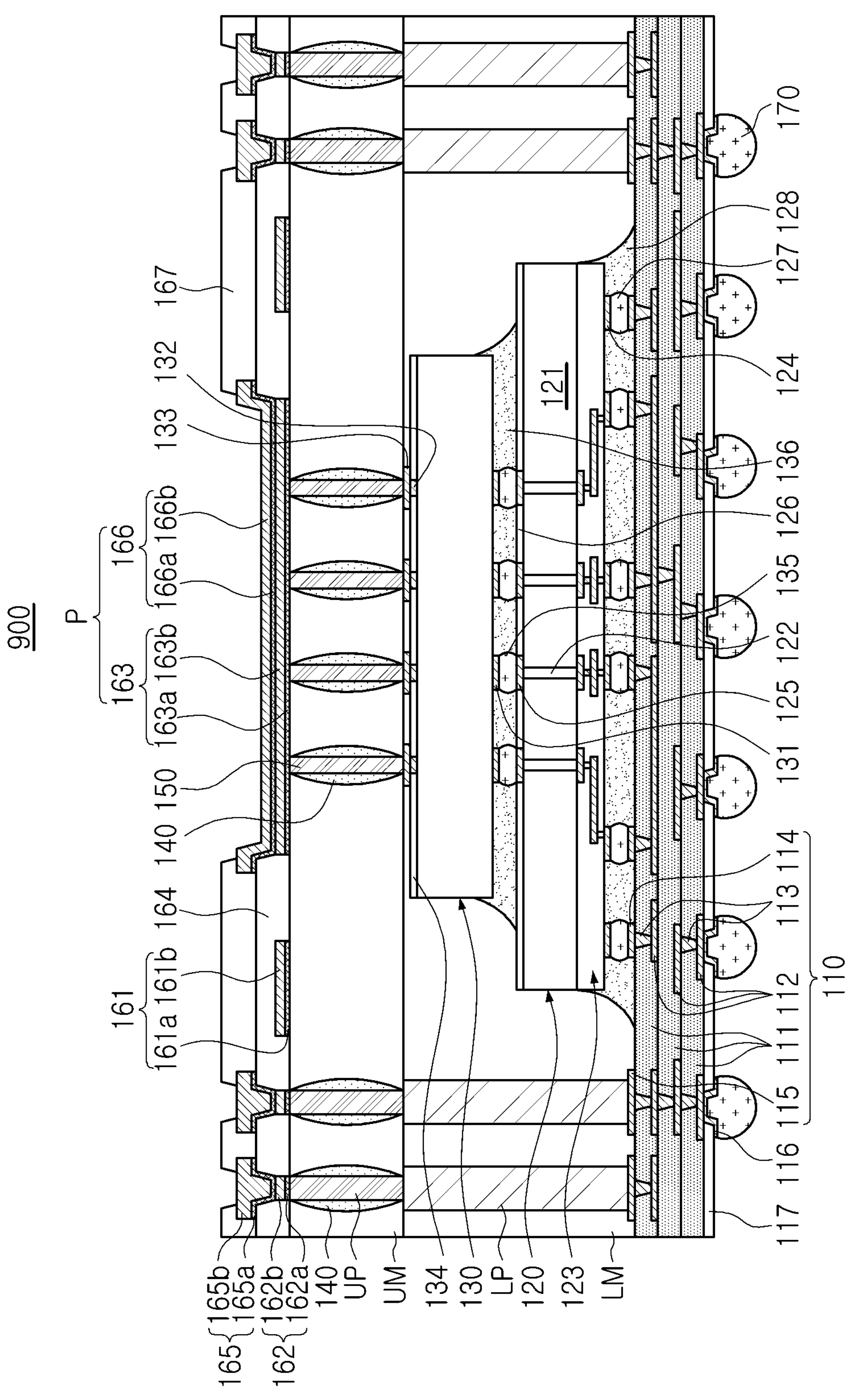

FIGS. 10 and 11 are cross-sectionals of a semiconductor package according to example embodiments.

Referring to FIG. 10, a semiconductor package 800 may include an upper conductive pillar UP on a lower conductive pillar LP and a heat dissipation pillar 150 on a heat dissipation pad 133. In an example embodiment, the upper conductive pillar UP may have a greater diameter than the lower conductive pillar LP. FIG. 10 illustrates that the diameter of the upper conductive pillar UP is greater than the diameter of the heat dissipation pillar 150, but an example embodiment thereof is not limited thereto. In FIG. 10, the diameter of upper conductive pillar UP may be greater than the diameter of the lower conductive pillar LP and the diameter of the heat dissipation pillar 150, and the diameter of the lower conductive pillar LP may be greater than the diameter of the heat dissipation pillar 150. In some example embodiments, the diameter of the upper conductive pillar UP may be the same as that of the heat dissipation pillar 150.

Referring to FIG. 11, a semiconductor package 900 may include an upper conductive pillar UP on a lower conductive pillar LP and a heat dissipation pillar 150 on a heat dissipation pad 133. In an example embodiment, the upper conductive pillar UP may have a greater diameter than the heat dissipation pillar 150. For example, the diameter of the upper conductive pillar UP may be a value selected from a range of about 0.05 mm to about 0.3 mm, and the diameter of the heat dissipation pillar 150 may be a value selected from a range of about 0.05 mm to about 0.1 mm. In FIG. 11, the diameter of lower conductive pillar LP may be greater than the diameter of the upper conductive pillar UP and the diameter of the heat dissipation pillar 150, and the diameter of the upper conductive pillar UP may be greater than the diameter of the heat dissipation pillar 150.

FIGS. 12 to 22 are cross-sectional views of a process sequence of a carrier substrate 10 to illustrate a method of manufacturing a semiconductor package according to example embodiments.

Figure 12:
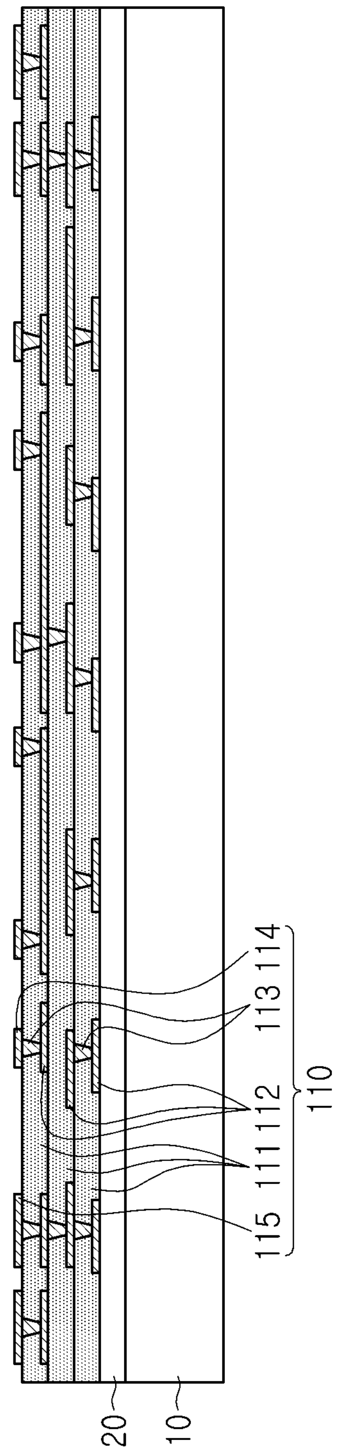
FIGS. 12 to 22 are cross-sectional views according to a process sequence to describe a method of manufacturing a semiconductor package according to example embodiments.

Referring to FIG. 12, a lower redistribution structure 110 may be formed on a carrier substrate 10 and an adhesive layer 20. The carrier substrate 10 may be a glass carrier, a ceramic carrier, a silicon wafer, or a conductive substrate including metal. The adhesive layer 20 may be disposed on the carrier substrate 10, and may attach the lower redistribution structure 110 to the carrier substrate 10. The adhesive layer 20 may include or may be formed of a polymer-based material. For example, the adhesive layer 20 may include or may be formed of a light-to-heat-conversion (LTHC) release coating material and may be thermally-released by heating. Alternatively, the adhesive layer 20 may include or may be formed of a UV adhesive, peeled off by ultra-violet (UV) light.

The lower redistribution structure 110 may be formed by repeatedly forming an insulating material on the adhesive layer 20, forming an opening by etching the insulating material, and forming a conductive material in the opening. In an example embodiment, the lower redistribution structure 110 may be formed by using a damascene process, and the conductive material may be formed using an electroplating method. The lower redistribution structure 110 may include an insulating layer, an internal wiring 112, a via 113, a first connection pad 114, and a second connection pad 115. The insulating layers may form a plurality of layers, the internal wirings 112 may be formed between the insulating layers, and the vias 113 may connect the internal wirings 112 of different layers with each other. The internal wiring 112 and the via 113 may be integrally formed and may be buried in insulating layers. The first connection pad 114 and the second connection pad 115 may be formed on an uppermost insulating layer among the insulating layers. The first connection pad 114 may be formed in a central portion of an upper surface of the lower redistribution structure 110, and the second connection pad 115 may be formed at an edge region of the upper surface of the lower redistribution structure 110. The first connection pad 114 and the second connection pad 115 may be electrically connected to the internal wiring 112 through the via 113.

The insulating layer may include or may be formed of a photo-imageable dielectric (PID). The internal wiring 112, the via 113, the first connection pad 114, and the second connection pad 115 may include or may be formed of a conductive material, for example, copper (Cu), aluminum (Al), silver (Ag), tin (Sn), gold (Au), nickel (Ni), lead (Pb), titanium (Ti), chromium (Cr), tungsten (W), or an alloy thereof. In an example embodiment, the conductive material may be formed using an electroplating method and may include a seed layer and a metal layer on the seed layer. For example, the seed layer may include or may be formed of at least one of titanium (Ti), nickel (Ni), chromium (Cr), and tungsten (W), and the metal layer may include or may be formed of copper (Cu).

Figure 13:
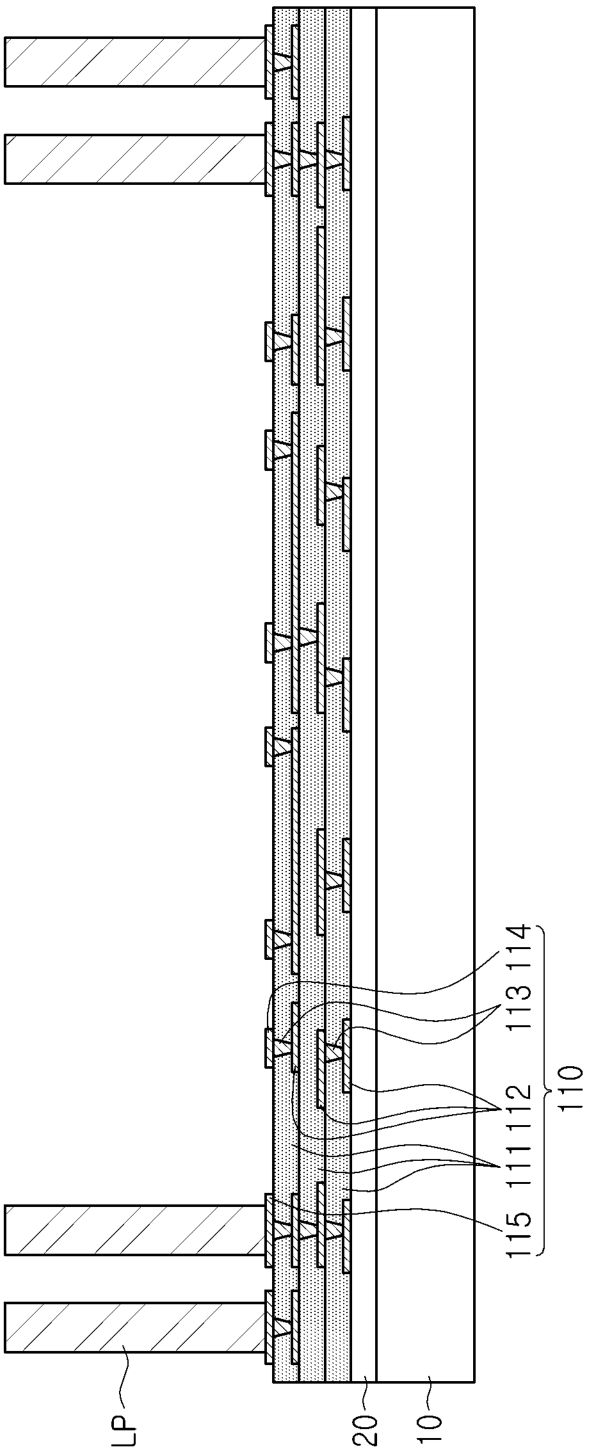

Referring to FIG. 13, a lower conductive pillar LP may be formed on the lower redistribution structure 110. The lower conductive pillar LP may be formed at an edge region of an upper surface of the lower redistribution structure 110 and may surround a central portion of the lower redistribution structure 110 in a plan view. The lower conductive pillar LP may be disposed on the second connection pad 115, and may be electrically connected to the lower redistribution structure 110. The lower conductive pillar LP may include or may be formed of copper (Cu), aluminum (Al), silver (Ag), tin (Sn), gold (Au), nickel (Ni), lead (Pb), titanium (Ti), and chromium (Cr), tungsten (W), or an alloy thereof. In an embodiment, the lower conductive pillar LP may include or may be formed of copper (Cu).

Figure 14:
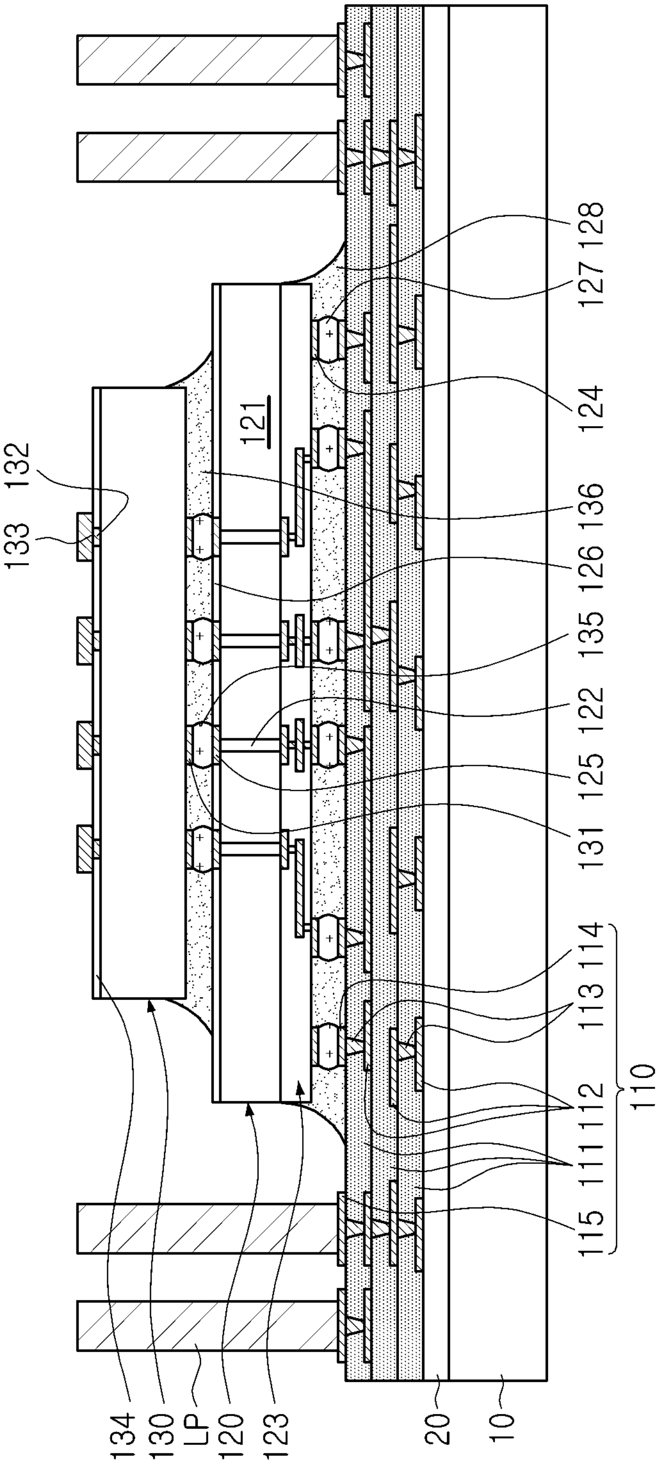

Referring to FIG. 14, a first semiconductor chip 120 and a second semiconductor chip 130 may be mounted on the lower redistribution structure 110. The first semiconductor chip 120 may include a semiconductor body 121, a through-electrode 122, a circuit layer 123, a chip pad 124, a chip connection pad 125, and a passivation layer 126. The semiconductor body 121 may include or may be formed of a semiconductor material, for example, a group IV semiconductor, a group compound semiconductor, or a group II-VI compound semiconductor. For example, the group IV semiconductor may include silicon, germanium or silicon-germanium.

The through-electrode 122 may penetrate through the semiconductor body 121 vertically, and the circuit layer 123 may be disposed below the semiconductor body 121 and electrically connected to the through-electrode 122. The chip pad 124 may be disposed below the circuit layer 123 and the chip connection pad 125 may be disposed above the semiconductor body 121. For example, the chip connection pad 125 may be connected to the through-electrode 122. The passivation layer 126 may cover an upper portion of the semiconductor body 121 and a side surface of the chip connection pad 125. An upper surface of the chip connection pad 125 may not be covered by the passivation layer 126. In an embodiment, an opening may penetrate the passivation layer 126 to expose the upper surface of the chip connection pad 125.

In an example embodiment, the first semiconductor chip 120 may be mounted on the lower redistribution structure 110 by flip chip bonding. For example, a connection bump 127 may be disposed below the chip pad 124, and the chip pad 124 may be electrically connected to the first connection pad 114 through the connection bump 127. An underfill 128 may cover a portion of the upper surface of the lower redistribution structure 110 and the connection bump 127.

The second semiconductor chip 130 may include a chip pad 131, a heat dissipation via 132, a heat dissipation pad 133, and a passivation layer 134. In an example embodiment, the second semiconductor chip 130 may be mounted on the first semiconductor chip 120 by flip chip bonding. For example a connection bump 135 may be disposed below the chip pad 131, and the chip pad 131 may be electrically connected to the chip connection pad 125 through the connection bump 135. An underfill 136 may cover a portion of the upper surface of the first semiconductor chip 120 and the connection bump 135. The second semiconductor chip 130 may be electrically connected to the lower redistribution structure 110 through the first semiconductor chip 120.

The heat dissipation via. 132 and the heat dissipation pad 133 may be disposed above the second semiconductor chip 130 and the passivation layer 134 may cover an upper surface of the second semiconductor chip 130. A side surface of the heat dissipation via 132 may be covered by the passivation layer 134. The heat dissipation pad 133 may be disposed on the heat dissipation via 132 and the passivation layer 134. In an embodiment, the heat dissipation pad 133 may contact the heat dissipation via 132 and the passivation layer 134. An upper surface of the heat dissipation pad 133 may be positioned at the same level as or higher than an upper surface of the lower conductive pillar LP. The heat dissipation via 132 and the heat dissipation pad 133 include or may be formed of copper (Cu), aluminum (Al), silver (Ag), tin (Sn), gold (Au), nickel (Ni), lead (Pb), titanium (Ti), chromium (Cr), tungsten (W), or an alloy thereof. In an embodiment, the heat dissipation via 132 may include or may be formed of copper (Cu).

Figure 15:
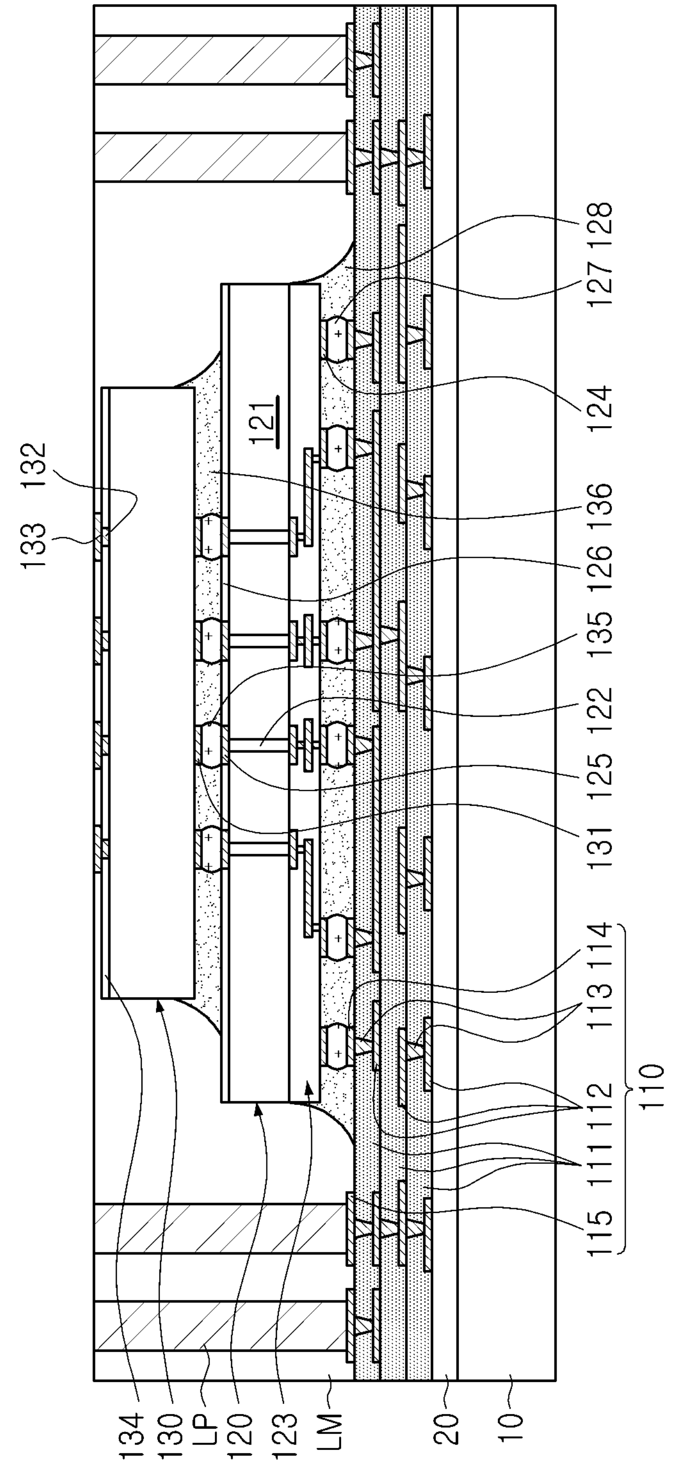

Referring to FIG. 15, a lower encapsulant LM may be formed. The lower encapsulant may be formed by forming an insulating material to cover the lower redistribution structure 110, the lower conductive pillar LP, the first semiconductor chip 120, and the second semiconductor chip 130, and then performing a planarization process so that an upper surface of the heat dissipation pad 133 is exposed. The planarization process may include grinding the insulating material using the heat dissipation pad 133 as a stopper. Upper portions of the lower conductive pillar LP and the heat dissipation pad 133 may be partially removed by the planarization process. Upper surfaces of the lower conductive pillar LP, the heat dissipation pad 133, and the 1 encapsulant LM after the planarization process may be coplanar with each other.

A portion of the lower encapsulant LM covering the second semiconductor is partially removed by the planarization process, but may not be entirely removed. For example, the lower encapsulant LM after the planarization process may cover an upper surface of the passivation layer 134 and a side surface of the heat dissipation pad 133, and may not cover an upper surface of the heat dissipation pad 133. Since an upper surface of the second semiconductor chip 130 (for example, the upper surface of the passivation layer 134) is covered by the lower encapsulant LM, the lower encapsulant LM may prevent warpage of the semiconductor package 100 during the manufacturing process.

The lower encapsulant LM may be a resin including epoxy or polyimide. For example, the resin may be a bisphenol-group epoxy resin, a polycyclic aromatic epoxy resin, an o-Cresol novolac epoxy resin, or a biphenyl epoxy resin, or a naphthalene-group epoxy resin.

Figure 16:
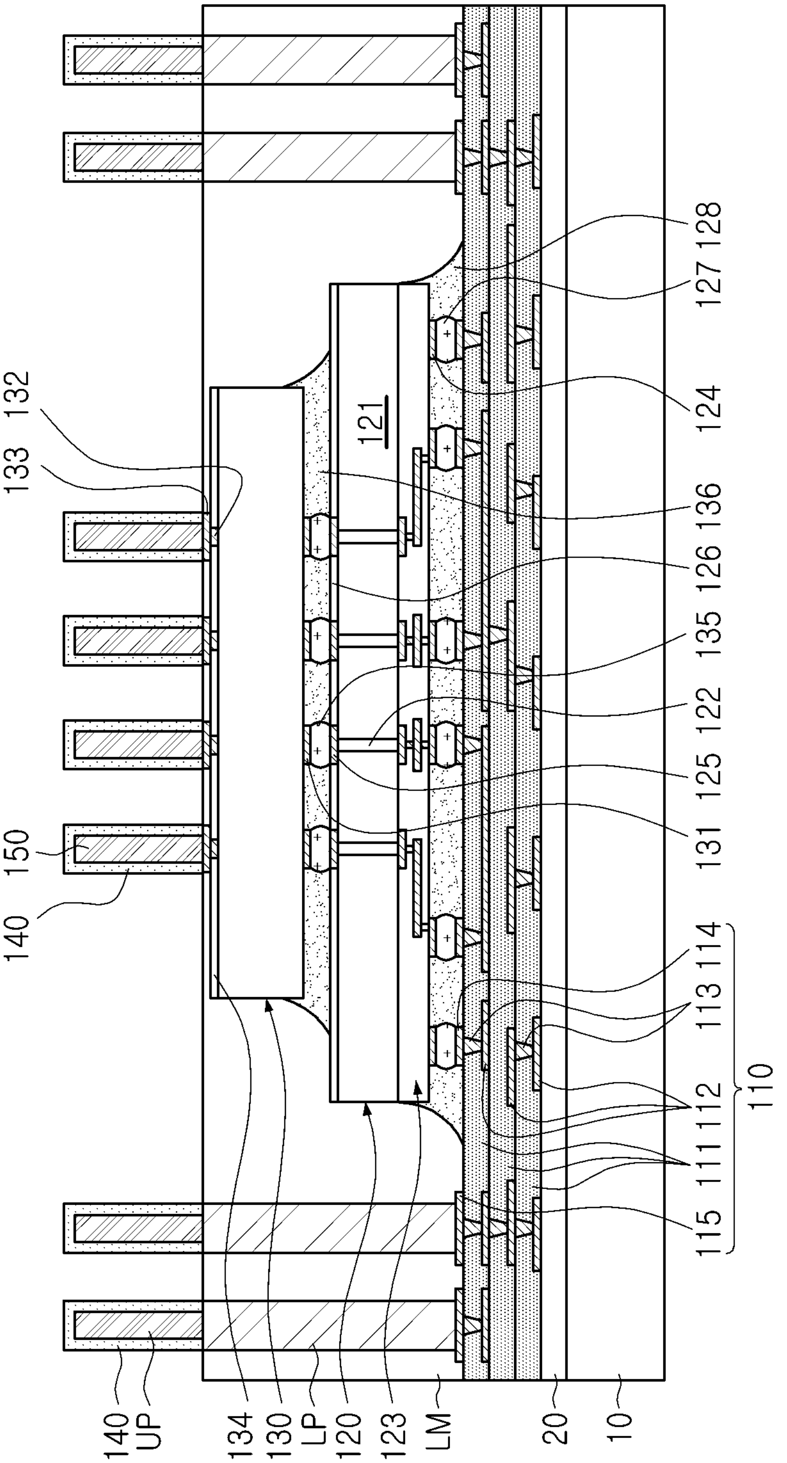

Referring to FIG. 16, an upper conductive pillar UP may be attached to the lower conductive pillar LP, and a heat dissipation pillar 150 may be attached to a heat dissipation pad 133. In an example embodiment, the upper conductive pillar UP and the heat dissipation pillar 150 may be attached using a solder ball attachment method. For example, an upper conductive pillar UP and a heat dissipation pillar 150 covered by a bonding member 140 may be prepared. The upper conductive pillar UP and the heat dissipation pillar 150 may include or may be formed of the same material as the lower conductive pillar LP, and may include or may be formed of, for example, copper (Cu). The bonding member 140 may include or may be formed of tin (Sn) or an alloy (Sn—Ag—Cu) containing tin (Sn). The upper conductive pillar UP and the heat dissipation pillar 150 covered by the bonding member 140 may be dipped into a flux pool filled with a flux. The flux may contain chlorides, fluorides and/or resins, and the like. When the upper conductive pillar UP and the heat dissipation pillar 150 are bonded to the lower conductive pillar LP and the heat dissipation pad 133, respectively, the flux surrounds a bonding portion therebetween to prevent contamination from the outside. Since the upper conductive pillar UP and the heat dissipation pillar 150 may be attached using a solder ball attachment method, a manufacturing process thereof may be simplified.

Figure 17:
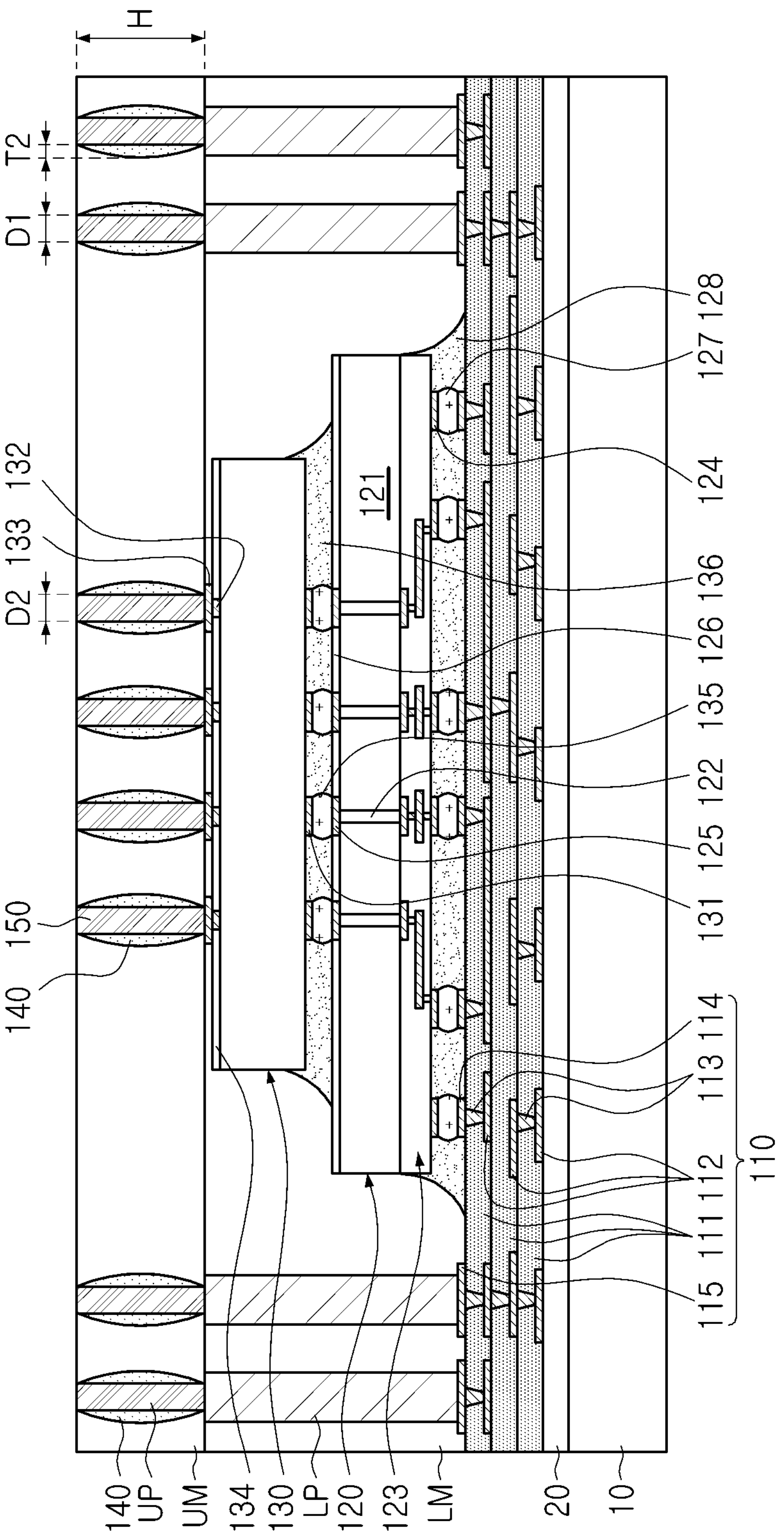

Referring to FIG. 17, a reflow process may be performed, and an upper encapsulant UM may be formed. Through the reflow process, the upper conductive pillar UP and the heat dissipation pillar 150 may be bonded to the lower conductive pillar LP and the heat dissipation pad 133, respectively, and a shape of a bonding member 140 may be deformed. The upper encapsulant UM may be formed by forming an insulating material to cover the lower encapsulant LM, the upper conductive pillar UP, and the heat dissipation pillar 150, and then performing a planarization process so that upper surfaces of the upper conductive pillar UP and the heat dissipation pillar 150 are exposed. Upper surfaces of the upper conductive pillar UP, the heat dissipation pillar 150, and the upper encapsulant UM after the planarization process may be coplanar with each other. The upper encapsulant UM may include or may be formed of the same material as the lower encapsulant LM.

A height H of the upper conductive pillar UP and the heat dissipation pillar 150 may be a value selected from a range of about 0.001 mm to 0.1 mm. A diameter D1 of the heat dissipation pillar 150 may be the same as a diameter D2 of upper conductive pillar UP and may be a value selected from a range of about 0.005 mm to about 0.1 mm. The bonding member 140 may have a thickness T2 of a value selected from a range of about 0.001 mm to about 0.5 mm. In an example embodiment, the thickness T2 of the bonding member 140 may be a value selected from a range of about 0.001 mm to about 0.1 mm. Here, the thickness T2 may mean a maximum thickness of the bonding member 140.

Figure 18:
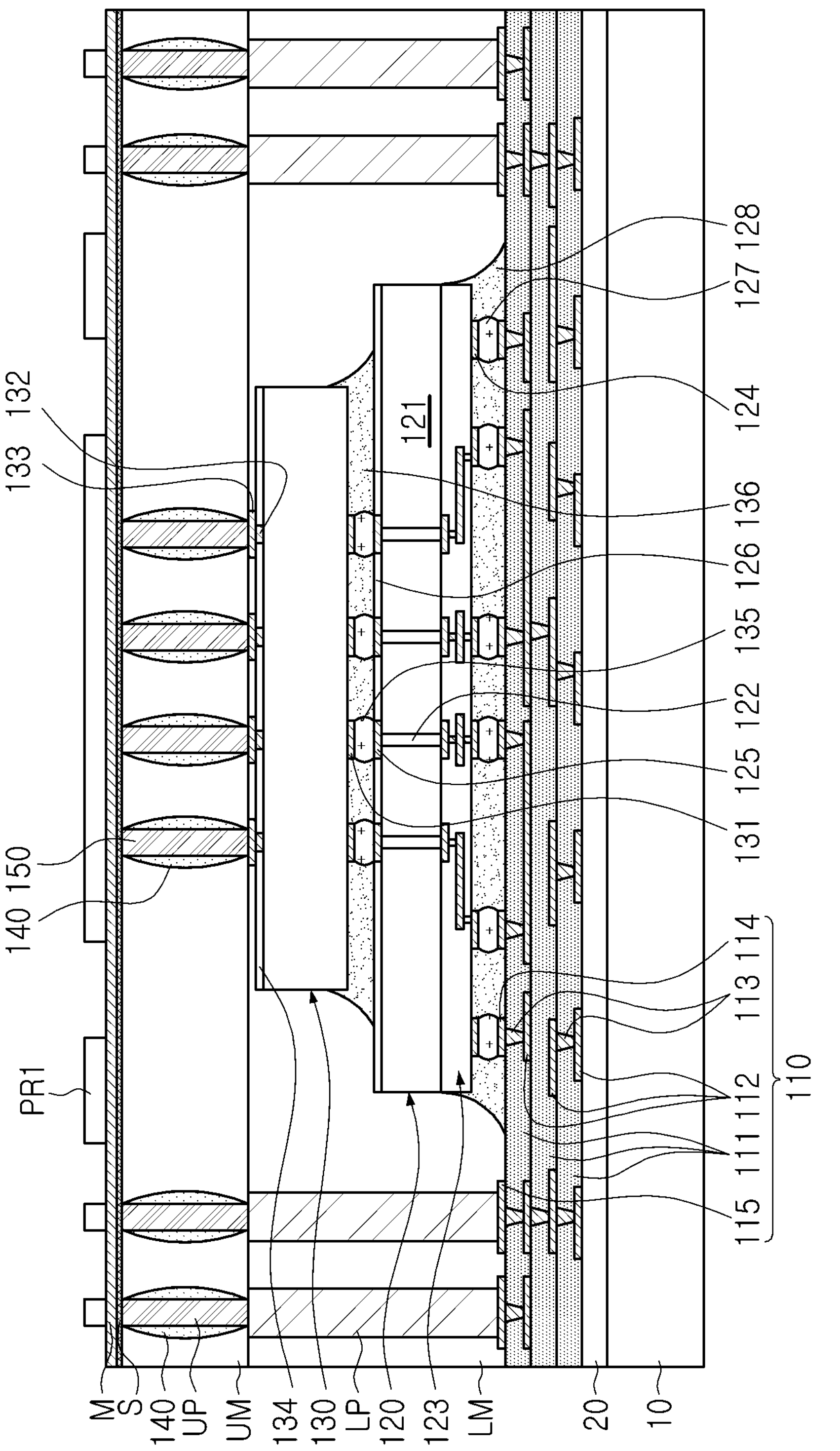

Referring to FIG. 18, a seed layer S and a metal layer M may be formed on upper surfaces of the upper conductive pillar UP, the heat dissipation pillar 150, and the upper encapsulant UM. In an example embodiment, the metal layer M may be formed by an electroplating method using the seed layer S. The seed layer S may include or may be formed of at least one of titanium (Ti), nickel (Ni), chromium (Cr), and tungsten (W). The metal layer M may include or may be formed of copper (Cu).

Thereafter, a photoresist PR1 may be formed on the metal layer M. The photoresist PR1 may be patterned to expose a portion of the metal layer M to be removed. For example, after forming a photosensitive material on the metal layer M, a portion of the metal layer M may be exposed by performing an exposure process and a developing process on the photosensitive material. Thereafter, the photoresist PR1 may be cured by a bake process.

Figure 19:
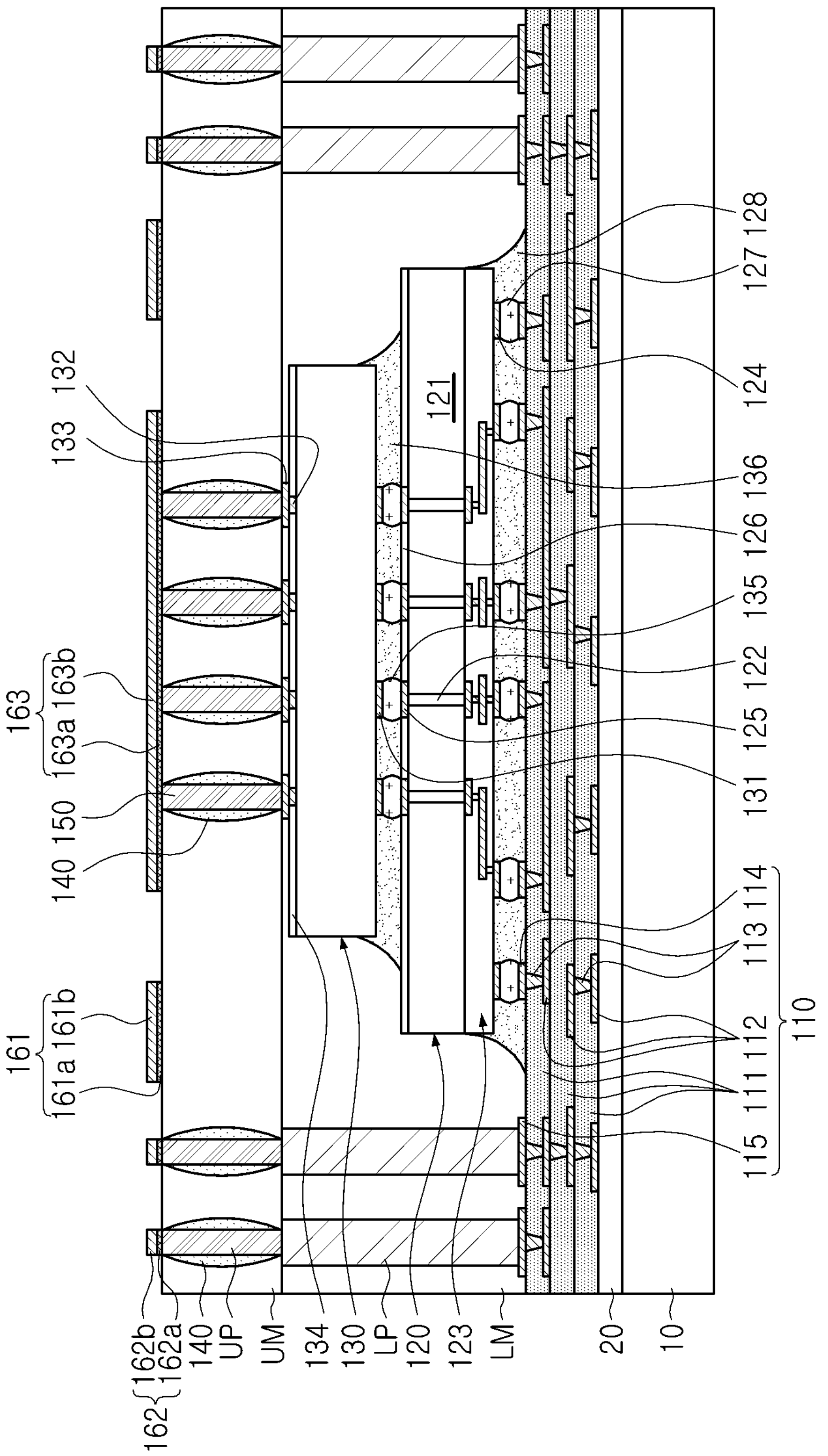

Referring to FIG. 19, a seed layer S and a metal layer M may be etched by an etching process using the photoresist PR1 as an etching mask. Through the etching process, an internal wiring 161 on the upper encapsulant UM, a lower connection pad 162 on the upper conductive pillar UP, and a lower heat dissipation plate 163 on the heat dissipation pillar 150 may be formed. The internal wiring 161, the lower connection pad 162, and the lower heat dissipation plate 163 may include seed layers 161*a*, 162*a*, and 163*a* and metal layers 161*b*, 162*b*, and 163*b*, respectively. The lower heat dissipation plate 163 may extend in a horizontal direction to cover all of the heat dissipation pillars 150. Thereafter, the photoresist PR1 may be removed by a strip process.

In an example embodiment, the lower heat dissipation plate 163 may contact the heat dissipation pillar 150. For example, another material such as an adhesive material may not be interposed between the lower heat dissipation plate 163 and the heat dissipation pillar 150. Accordingly, heat transfer efficiency from the heat dissipation pillar 150 to the lower heat dissipation plate 163 may increase.

Figure 20:
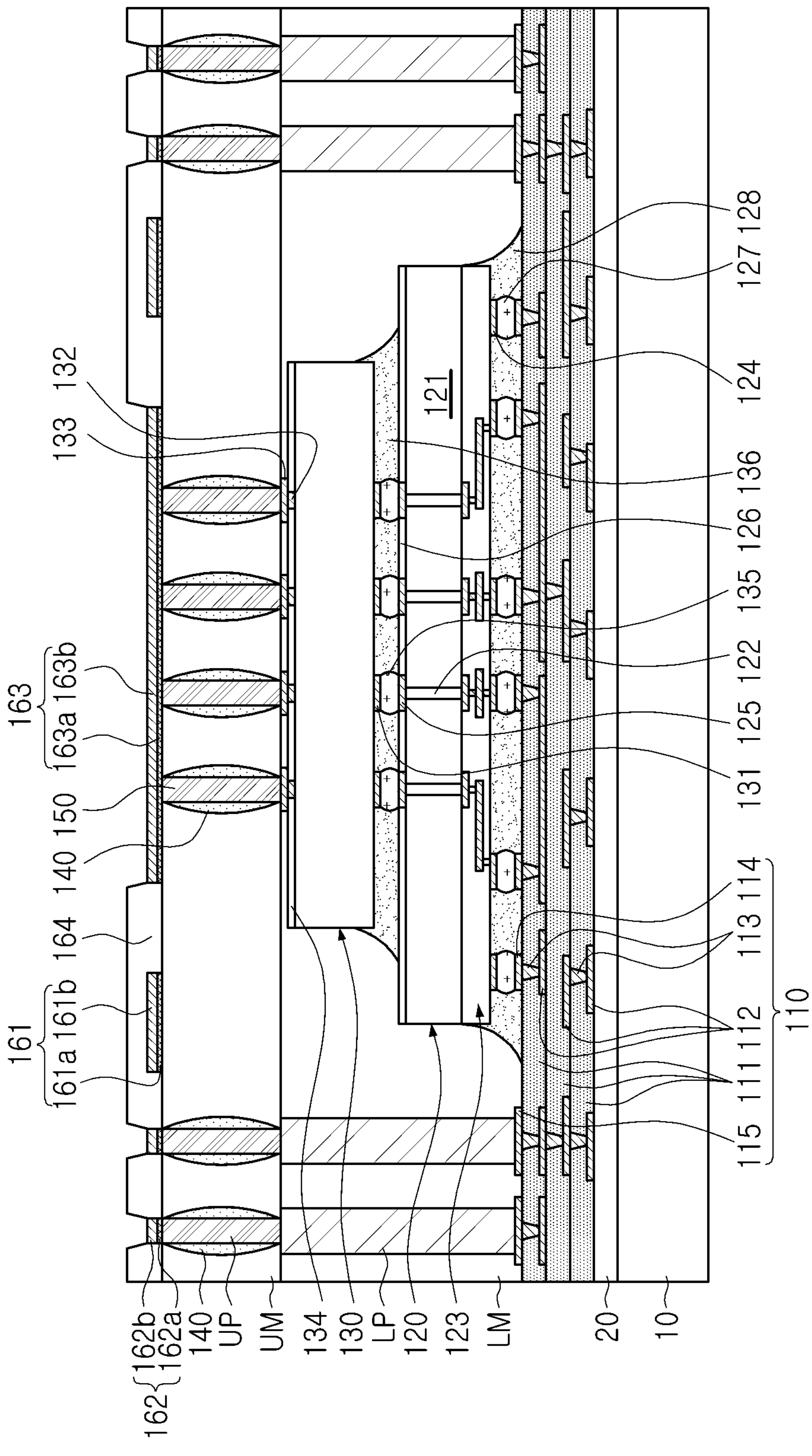

Referring to FIG. 20, a lower insulating layer 164 may be formed, and a lower connection pad 162 and a lower heat dissipation plate 163 may be exposed. The lower insulating layer 164 may be formed by forming an insulating material to cover the internal wiring 161, the lower connection pad 162, and the lower heat dissipation plate 163, and then patterning the insulating material. The lower insulating layer 164 may include or may be formed of photosensitive insulating material (PID).

Figure 21:
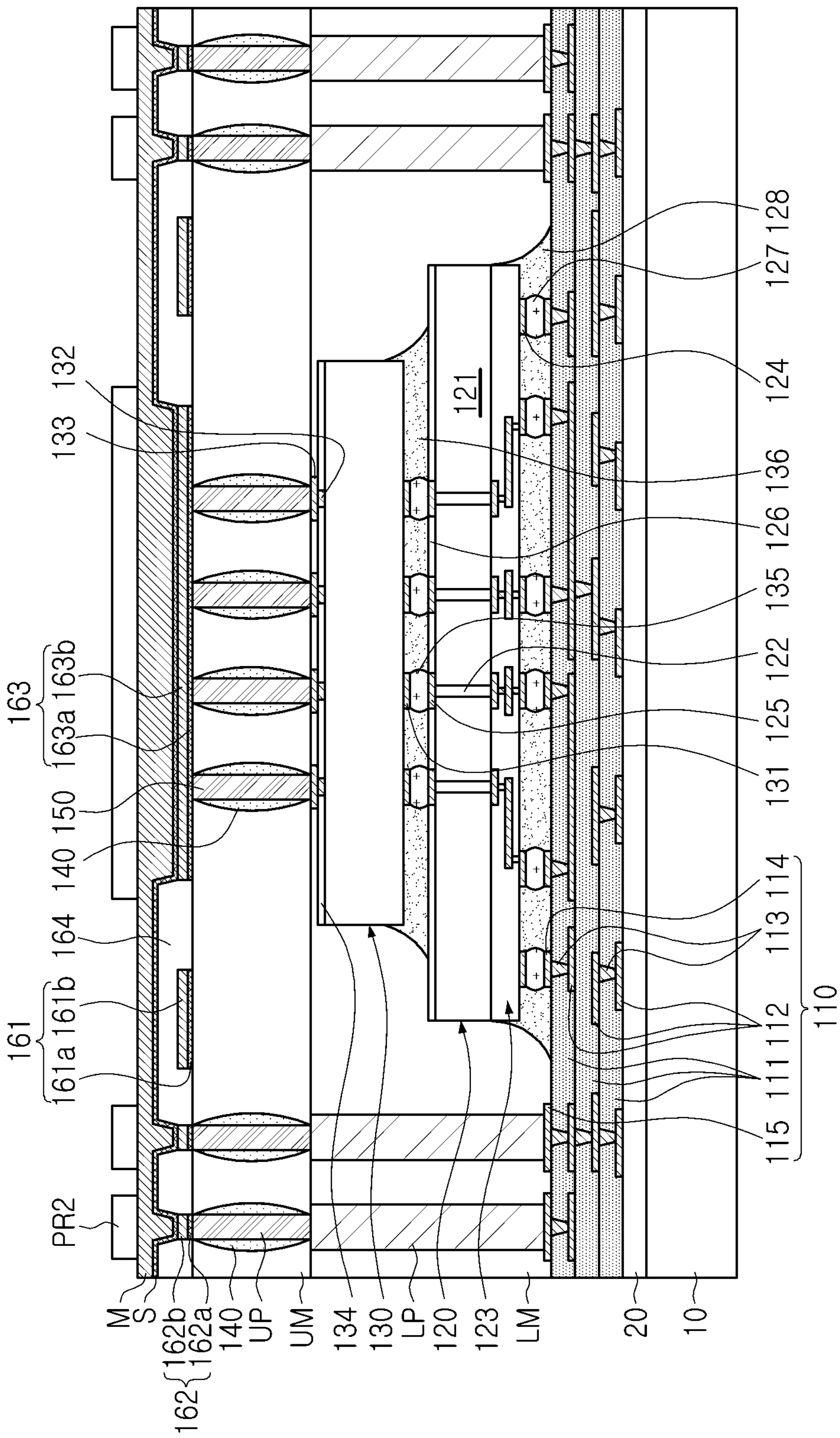

Referring to FIG. 21, a seed layer S and a metal layer M may be formed on upper surfaces of the lower connection pad 162, the lower heat dissipation plate 163, and the lower insulating layer 164. A photoresist PR2 may be formed on the metal layer M. A process of forming the seed layer S, the metal layer M, and the photoresist PR2 may be the same as or similar to that described with reference to FIG. 19.

Figure 22:
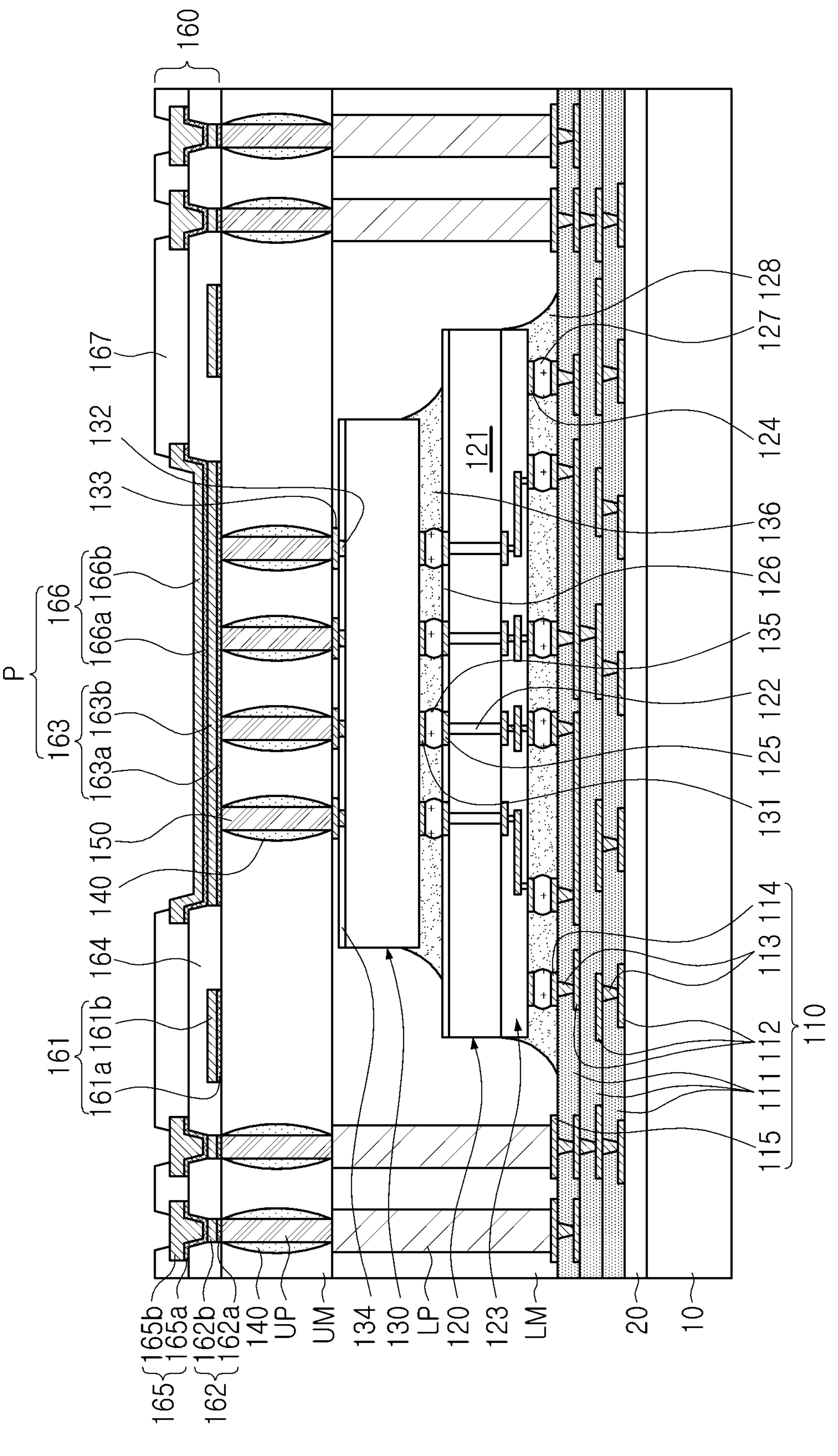

Referring to FIG. 22, the seed layer S and the metal layer M may be etched to form an upper connection pad 165 including a seed layer 165*a* and a metal layer 165*b*, and an upper heat dissipation plate 166 including a seed layer 166*a* and a metal layer 166*b* may be formed. The photoresist PR2 may be removed, and an upper insulating layer 167 may be formed on the lower insulating layer 164. The upper insulating layer 167 may expose the upper connection pad 165 and the upper heat dissipation plate 166. The internal wiring 161, the lower connection pad 162, the lower insulating layer 164, the upper connection pad 165, and the upper insulating layer 167 may form an upper redistribution structure 160. The lower heat dissipation plate 163 and the upper heat dissipation plate 166 may form a heat dissipation structure P. FIG. 22 illustrates that the heat dissipation structure P is comprised of two layers of heat dissipation plates, but an example embodiment thereof is not limited thereto. In some example embodiments, the heat dissipation structure P may be comprised of one layer of heat dissipation plate or three or more layers of heat dissipation plates. The heat dissipation structure P may not be electrically connected to the lower redistribution structure 110, the lower conductive pillar LP, the upper conductive pillar UP, and the upper redistribution structure 160. In an embodiment, the heat dissipation structure P may be electrically floating. According to example embodiments of the present disclosure, a process of forming the heat dissipation structure P is performed together with the process of forming the upper redistribution structure 160, so the manufacturing process may be simplified.

Referring to FIG. 1, the carrier substrate 10 and the adhesive layer 20 may be removed, and a bump pad 116, an insulating layer 117, and an external connection terminal 170 may be formed below the lower redistribution structure 110. The bump pad 116 may be electrically connected to the internal wiring 112 of the lower redistribution structure 110. The insulating layer may cover a lower surface of the lower redistribution structure 110, and may expose the bump pads 116. The external connection terminal 170 may be attached to the bump pad 116.

Figure 23:
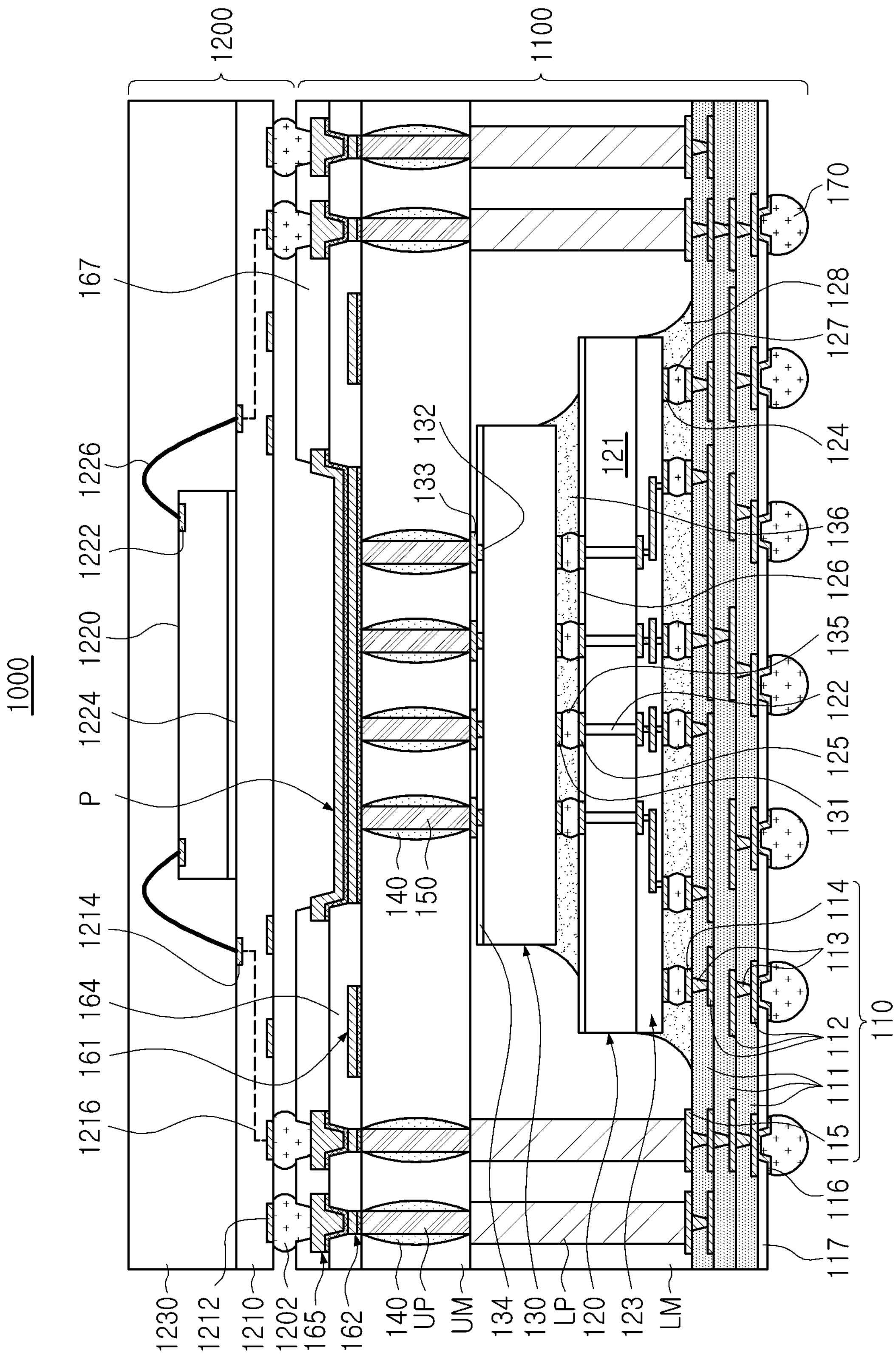
FIG. 23 is a cross-sectional view of a semiconductor package according to example embodiments.

FIG. 23 is a cross-sectional view of a semiconductor package according to example embodiments.

Referring to FIG. 23, a semiconductor package 1000 may have a package-on-package structure. For example, the semiconductor package 1000 may include a lower package 1100 and an upper package 1200. Since the lower package 1100 may include the same or similar structure as the semiconductor packages as described with reference to FIGS. 1 to 11, a detailed description of the lower package 1100 may be omitted.

The upper package 1200 may be connected to the lower package 1100 through a package connection terminal 1202. The upper package 1200 may include a substrate 1210, a semiconductor chip 1220, and an encapsulant 1230. The substrate 1210 may include a lower pad 1212, an upper pad 1214, and an interconnection 1216 electrically connecting the lower pad 1212 and the upper pad 1214. The lower pad 1212 may contact the package connection terminal 1202.

The semiconductor chip 1220 may include a chip pad 1222 on an upper surface of the semiconductor chip 1220, and may be attached to the substrate 1210 by an adhesive layer 1224. In an example embodiment, the semiconductor chip 1220 may be mounted on the substrate 1210 by wire bonding. For example, a chip pad 1222 of the semiconductor chip 1220 may be connected to an upper pad 1214 by a wire 1226. In an example embodiment, the semiconductor chip 1220 may be a memory chip. The encapsulant 1230 may cover the substrate 1210 and the semiconductor chip 1220.

As set forth above, as example embodiments of the present inventive concept, a semiconductor package may include a heat dissipation pillar connected to a semiconductor chip and a heat dissipation structure connected to the heat dissipation pillar and exposed externally. Therefore, heat generated in the semiconductor package can be efficiently dissipated.

While example embodiments have been shown and described above, it will be apparent to those skilled in the art that modifications and variations could be made without departing from the scope of the present inventive concept as defined by the appended claims.

What is claimed is:

1. A semiconductor package comprising:
a lower redistribution structure;
a first semiconductor chip disposed on a first region of the lower redistribution structure;
a second semiconductor chip stacked on the first semiconductor chip,
wherein the second semiconductor chip includes a heat dissipation pad that is disposed at an upper surface of the second semiconductor chip;
a lower conductive pillar disposed on a second region of the lower redistribution structure, wherein, when viewed in a plan view, the second region is disposed outside an outer boundary of the first region;
an upper conductive pillar disposed on the lower conductive pillar;
a heat dissipation pillar disposed on the heat dissipation pad;
an upper redistribution structure disposed on the upper conductive pillar; and
a heat dissipation structure disposed on the heat dissipation pillar,
wherein the heat dissipation structure contacts the heat dissipation pillar.

2. The semiconductor package of claim 1, further comprising:
a first bonding member covering a side surface of the upper conductive pillar; and
a second bonding member covering a side surface of the heat dissipation pillar.

3. The semiconductor package of claim 1,
wherein the heat dissipation pillar includes a lower end contacting the heat dissipation pad and an upper end contacting the heat dissipation structure, and
wherein heat generated from the second semiconductor chip is dissipated to the outside of the semiconductor package via the heat dissipation pillar and the heat dissipation structure.

4. The semiconductor package of claim 1,
wherein the heat dissipation structure includes:
a lower heat dissipation plate contacting the heat dissipation pillar; and
an upper heat dissipation plate disposed on the lower heat dissipation plate.

5. The semiconductor package of claim 1,
wherein the second semiconductor chip further includes:
a heat dissipation via disposed below the heat dissipation pad; and
a passivation layer covering a side surface of the heat dissipation via.

6. The semiconductor package of claim 1,
wherein a lower surface of the upper conductive pillar is coplanar with a lower surface of the heat dissipation pillar.

7. The semiconductor package of claim 1,
wherein the upper redistribution structure has an opening in which the heat dissipation structure is disposed, and
wherein the upper redistribution structure surrounds the heat dissipation structure.

8. The semiconductor package of claim 1,
wherein the heat dissipation structure is electrically separated from the upper redistribution structure.

9. The semiconductor package of claim 1,
wherein a height of the upper conductive pillar is the same as a height of the heat dissipation pillar.

10. The semiconductor package of claim 9,
wherein the height of the upper conductive pillar is a value selected from a range of about 0.001 mm to about 0.1 mm.

11. The semiconductor package of claim 1,
wherein a diameter of the upper conductive pillar is greater than a diameter of the lower conductive pillar.

12. The semiconductor package of claim 1,
wherein the upper conductive pillar has a diameter having a value selected from a range of about 0.005 mm to about 0.1 mm.

13. The semiconductor package of claim 1,
wherein a diameter of the heat dissipation pillar is smaller than the diameter of the upper conductive pillar.

14. The semiconductor package of claim 1,
wherein the heat dissipation structure has a thickness having a value selected from a range of about 0.001 mm to about 0.1 mm.

15. A semiconductor package comprising:
a lower redistribution structure;
a first connection layer disposed on the lower redistribution structure and including a first semiconductor chip disposed on the lower redistribution structure and a second semiconductor chip disposed on the first semiconductor chip;
a second connection layer disposed on the first connection layer and including a heat dissipation pillar disposed on the second semiconductor chip;
an upper redistribution structure disposed on the second connection layer, wherein the upper redistribution structure has an opening exposing a portion of the second connection layer; and
a heat dissipation structure disposed in the opening and connected to the heat dissipation pillar.

16. The semiconductor package of claim 15,
wherein the first connection layer further includes:
a lower conductive pillar disposed on the lower redistribution structure, wherein, when viewed in a plan view, the lower conductive pillar is disposed outside an outer boundary of the first semiconductor chip and an outer boundary of the second semiconductor chip; and
a lower encapsulant covering an upper surface of the lower redistribution structure, and a sidewall of each of the lower conductive pillar, the first semiconductor chip, and the second semiconductor chip.

17. The semiconductor package of claim 16, wherein the second connection layer further includes:

an upper conductive pillar disposed on the lower conductive pillar; and an upper encapsulant covering a sidewall of the upper conductive pillar and a sidewall of the heat dissipation pillar.

18. The semiconductor package of claim 15, wherein a lower surface of the heat dissipation structure is coplanar with a lower surface of the upper redistribution structure.

19. A semiconductor package comprising:

a lower redistribution structure;

a first semiconductor chip and a second semiconductor chip stacked on the lower redistribution structure, wherein the second semiconductor chip is disposed between the first semiconductor chip and the lower redistribution structure, and wherein the second semiconductor chip includes a heat dissipation pad that is disposed at an upper surface of the second semiconductor chip and a heat dissipation via disposed under the heat dissipation pad;

a lower conductive pillar disposed on the lower redistribution structure;

a lower encapsulant covering an upper surface of the lower redistribution structure, and a sidewall of each of the lower conductive pillar, the first semiconductor chip, and the second semiconductor chip;

an upper conductive pillar disposed on the lower conductive pillar;

a heat dissipation pillar disposed on the heat dissipation pad;

a first bonding member covering a side surface of the upper conductive pillar;

a second bonding member covering a side surface of the heat dissipation pillar;

an upper encapsulant covering a side surface of each of the first bonding member and the second bonding member;

an upper redistribution structure disposed on the upper conductive pillar; and a heat dissipation structure disposed on the heat dissipation pillar, wherein the upper redistribution structure includes an opening in which the heat dissipation structure is disposed, and wherein the upper redistribution structure surrounds the heat dissipation structure.

* * * * *